United States Patent
De Natale et al.

(10) Patent No.: US 9,755,635 B2
(45) Date of Patent: Sep. 5, 2017

(54) ELECTRONIC SYSTEM FOR AN ELECTRICAL APPARATUS AND RELATED METHOD

(71) Applicant: ABB Technology AG, Zurich (CH)

(72) Inventors: Gabriele Valentino De Natale, Milan (IT); Luciano Di Maio, Milan (IT); Andrea Bianco, Sesto San Giovanni (IT)

(73) Assignee: ABB Schweiz AG, Baden (CH)

( * ) Notice: Subject to any disclaimer, the term of this patent is extended or adjusted under 35 U.S.C. 154(b) by 741 days.

(21) Appl. No.: 14/291,546

(22) Filed: May 30, 2014

(65) Prior Publication Data
US 2014/0265636 A1 Sep. 18, 2014

Related U.S. Application Data

(63) Continuation of application No. PCT/EP2011/071426, filed on Nov. 30, 2011.

(51) Int. Cl.
*H03K 17/22* (2006.01)
*H03K 5/1252* (2006.01)

(52) U.S. Cl.
CPC .......... *H03K 17/22* (2013.01); *H03K 5/1252* (2013.01); *Y10T 307/766* (2015.04); *Y10T 307/773* (2015.04); *Y10T 307/826* (2015.04)

(58) Field of Classification Search
CPC ............................. H03K 5/1252; H03K 17/22
See application file for complete search history.

(56) References Cited

U.S. PATENT DOCUMENTS

| | | | | |
|---|---|---|---|---|
| 4,305,091 A * | 12/1981 | Cooper | ................... | H04B 1/10 327/552 |
| 6,104,221 A | 8/2000 | Hoon | | |
| 2008/0246544 A1 | 10/2008 | Fujino et al. | | |
| 2010/0001701 A1* | 1/2010 | Cygan | ................... | H03F 3/2173 323/282 |
| 2012/0025913 A1* | 2/2012 | Honda | ................... | H03F 1/0222 330/291 |

OTHER PUBLICATIONS

International Search Report (PCT/ISA/210) mailed on Jul. 10, 2012, by the European Patent Office as the International Searching Authority for International Application No. PCT/EP2011/071426.
Written Opinion (PCT/ISA/237) mailed on Jul. 10, 2012, by the European Patent Office as the International Searching Authority for International Application No. PCT/EP2011/071426.

* cited by examiner

*Primary Examiner* — Jeffrey Shin
(74) *Attorney, Agent, or Firm* — Taft Stettinius & Hollister LLP

(57) ABSTRACT

An electronic system is disclosed for an associated electrical apparatus, the system having at least a binary input adapted to receive one or more candidate signals; at least an electronic active load having one or more electronic active devices and operatively connected to the binary input; and a controller operatively associated to the binary input and to the active load. The controller can detect application of a candidate signal to the binary input and electrically drive the active load upon such detection; and after absorption of a predetermined amount of energy, validate the candidate signal if its residual content of energy exceeds a predetermined threshold.

20 Claims, 15 Drawing Sheets

ELECTRONIC SYSTEM FOR AN ELECTRICAL APPARATUS AND RELATED METHOD

RELATED APPLICATION

This application claims priority as a continuation application under 35 U.S.C. §120 to PCT/EP2011/071426 filed as an International Application on Nov. 30, 2011 designating the U.S., the entire content of which is hereby incorporated by reference in its entirety.

FIELD

The present disclosure relates to an electronic system and method for validating an electrical signal applied to such system.

BACKGROUND INFORMATION

Electronic systems are provided in an electrical apparatus, e.g. in an apparatus for a low or medium voltage application, to execute several tasks, for example power or control tasks.

For the purpose of the present description the term "medium voltage" is referred to electrical applications in the voltage range between 1 kV and some tens of kVs, e.g. 50 kV, while the term "low voltage" is referred to electrical applications having a voltage below 1 kV.

An electronic system can include one or more binary inputs, each adapted to receive an input and detect at least an electrical signal or command. The electronic system can include a controller associated with the binary inputs and adapted to execute various tasks according to the detection of the signals received by each binary input.

For instance, electronic systems with one or more binary inputs are used in switching devices, such as in switching devices for low or medium voltage circuits, e.g. circuit breakers, disconnectors and contactors, or in the switchgears or electrical cabinets where such switching devices are installed. For example, the binary inputs of such electronic systems are adapted to receive status information and/or commands for the associated switching device.

For example, the binary input can receive in input and detect a trip command generated into the switching device or received by remote. According to such application, the electronic system can be installed into the trip circuit of the switching device, such trip circuit having at least: a protection device, or relay, adapted to generate the trip command due to the detection of a fault condition; and an opening actuator, such as a coil actuator. The electronic system can be adapted (i.e., configured) to drive the opening actuator upon the detection of the trip command applied to the binary input, so as to open the switching device through the intervention of the opening actuator.

According to another exemplary application, the binary input can receive and detect an electrical signal indicative of an operative condition of the switching device, such as a signal indicative of the coupled or separated position of the contacts of the switching device itself.

Electronic systems with binary inputs have to withstand a large number of disturbances, some of which may possess a not negligible energy level.

Therefore, a noise or disturb signal can also be applied to and detected by the binary input as a signal generated for the electronic system, such as for causing execution of one or more tasks of the electronic system.

For this reason, a validation device can be associated to the binary input and function so as to validate the candidate signals applied thereto (which may be noise signals or signals generated for the electronic system).

The noise immunity of the electronic system, i.e. the capability of discriminating between a noise signal and a command or signal generated to be detected and validated, can strongly depend on the energy absorption performed by the electronic system, for example by the binary input, on the candidate signal applied to the binary input. For example, as demonstrated by electromagnetic measures and tests in laboratory, low noise immunity is associated with a low energy absorption performed by the binary input on the candidate signal applied thereto.

At the current state of the art the binary inputs are electronic circuits having associated high input impedance, so they are able to absorb only a very small amount of energy from the candidate signal applied thereto. Therefore, the validation function associated to a binary input could validate a disturbance or noise signal as a command or signal generated to be detected, compromising the correct working of the associated electrical apparatus.

For example, a disturbance signal may be applied to the binary input of an electronic system installed in the trip circuit of a switching device; since the binary input absorbs only a small amount of energy from the applied disturb, the associated validation function may validate such disturb as a valid trip command, generated for instance from the protection relay.

According to such validation, the electronic system drives the opening actuator to open the switching device, even if this opening operation has never been really requested.

At the current state of the art, the validation function associated to a binary input can be adapted to execute filtering operations, for example by using digital filtering techniques, to perform the signal validation; such as, the filtering time is set long in order to increase the noise immunity of the electronic system.

FIG. 1 illustrates for example a disturb signal 500 and a digital signal 501 generated to be detected and validated, which may both be a candidate input signal applied to a binary input of an electronic system known in the art. As shown in FIG. 2, when the application of such input candidate signal is detected at the detect time $T_{detect}$, the validation device can start to filter the detected candidate signal for a long filtering time $T_F$, and at the end of such filtering, validate the signal.

Setting a long filtering time can jeopardize the time response of the overall system, while in some applications, such as the control of the opening of a switching device, the electronic system has to execute its tasks as soon as possible after receiving a command or other relevant electrical information.

According to another known solution, one or more passive devices, such as resistors, are connected to the binary input in order to increase the noise immunity. The passive devices can be connected to the binary input so as to realize a passive load suitable for dissipating from the applied candidate signal an amount of energy which depends on the fixed impedance of such passive load.

The passive devices continuously dissipate power while the candidate signal is applied to the binary input, heating themselves and the other electronic devices placed on the same electronic board; such heating can become particularly critical when the candidate signal remains applied to the binary input for a long time, such as in applications wherein a signal is continuously provided to the binary input.

Therefore, at the current state of the art, although known solutions can perform in acceptable fashion, there is still desire for further improvements.

SUMMARY

An electronic system is disclosed for an associated electrical apparatus, comprising at least a binary input adapted to receive one or more candidate signals; at least an electronic active load having one or more electronic active devices and operatively connected to said binary input; and control means which are operatively associated to said binary input and to said active load, and which are configured to: detect application of a candidate signal to the binary input and electrically drive said active load upon said detection, such that the active load will absorb at least a predetermined amount of energy from the candidate signal; and after absorption of said predetermined amount of energy validate the candidate signal if its residual content of energy exceeds a predetermined threshold.

A method is disclosed for validating a candidate signal applied to a binary input in an electronic system associated to an electrical apparatus, said method comprising: operatively connecting at least an electronic active load having one or more electronic active devices to said binary input; detecting application of said candidate signal to the binary input; electrically driving said active load to absorb at least a predetermined amount of energy from the candidate signal upon detection of the application of said candidate signal; and after the absorption of said predetermined amount of energy, validating the candidate signal if its residual content of energy exceeds a predetermined threshold.

BRIEF DESCRIPTION OF THE DRAWINGS

Further characteristics and advantages will be more apparent from the description of exemplary, but non-exclusive, embodiments of the electronic system and the methods according to the present disclosure, illustrated in the accompanying drawings, wherein.

Figure 1:
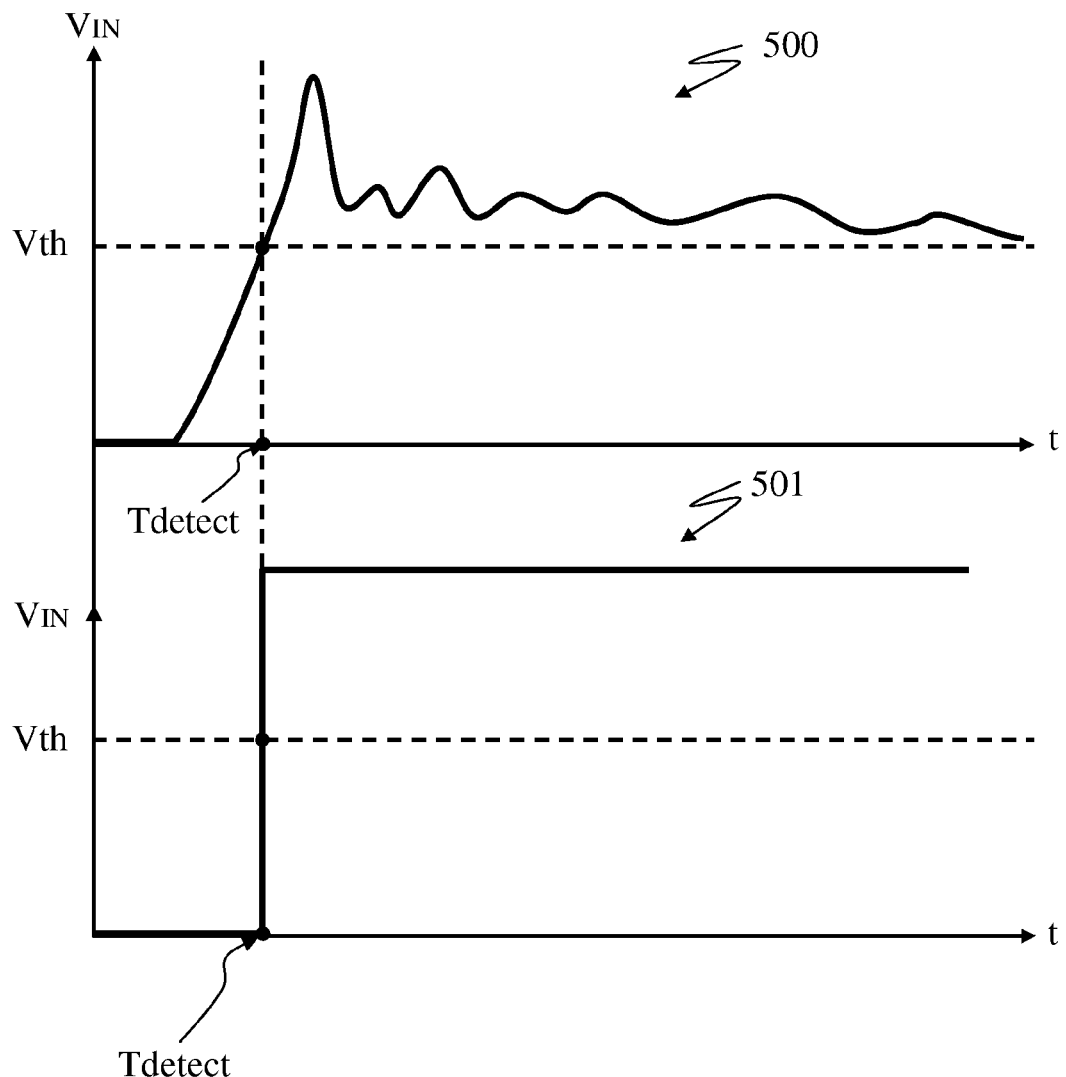
FIG. 1 shows a noise signal and a digital signal, respectively, which may be applied to and detected by an electronic system.

It should be noted that in the detailed description that follows, identical or similar components, either from a structural and/or functional point of view, have the same reference numerals, regardless of whether they are shown in different embodiments of the present disclosure; it should also be noted that in order to clearly and concisely describe the present disclosure, the drawings may not necessarily be to scale and certain features of the disclosure may be shown in somewhat schematic form.

DETAILED DESCRIPTION

An electronic system is disclosed for an associated electrical apparatus, having at least a binary input adapted to receive one or more candidate signals, at least an electronic active load having one or more electronic active devices and operatively connected to the binary input, control means which are operatively associated to the binary input and to the active load, and which are adapted to detect application of a candidate signal to the binary input and electrically drive the active load upon such detection, such that the active load absorbs at least a predetermined amount of energy from the candidate signal, after the absorption of the predetermined amount of energy, validate the candidate signal if its residual content of energy exceeds a predetermined threshold.

Another aspect of the present disclosure is to provide an electrical apparatus having an electronic system as the electronic system described herein.

Another aspect of the present disclosure is to provide a switchgear having an electrical apparatus and/or at least an electronic system, as the electrical apparatus and the electronic system disclosed in the following description.

Another aspect of the present disclosure is to provide a method for validating a candidate signal applied to a binary input in an electronic system associated to an electrical apparatus. The method can include operatively connecting at least an electronic active load having one or more electronic active devices to the binary input, detecting the application of the candidate signal to the binary input, electrically driving the active load to absorb at least a predetermined amount of energy from the candidate signal upon the detection of the application of the candidate signal, after the absorption of the predetermined amount of energy, validating the candidate signal if its residual content of energy exceeds a predetermined threshold.

In the following description an electronic system and related method according to the present disclosure will be described by making particular reference to their use in switching devices, such as in circuit breakers suitable for being installed in a low or medium voltage electric circuit. Such application has to be understood only as an illustrative and non-limiting example since the principles and technical solutions introduced in the following description can be applied to other types of switching devices, such as contactors, or disconnectors or high voltage switching devices (e.g., devices for applications with voltages above 50 kV), and even to other types of electrical apparatuses, such as for example transformers, motors or generators.

Figure 12:
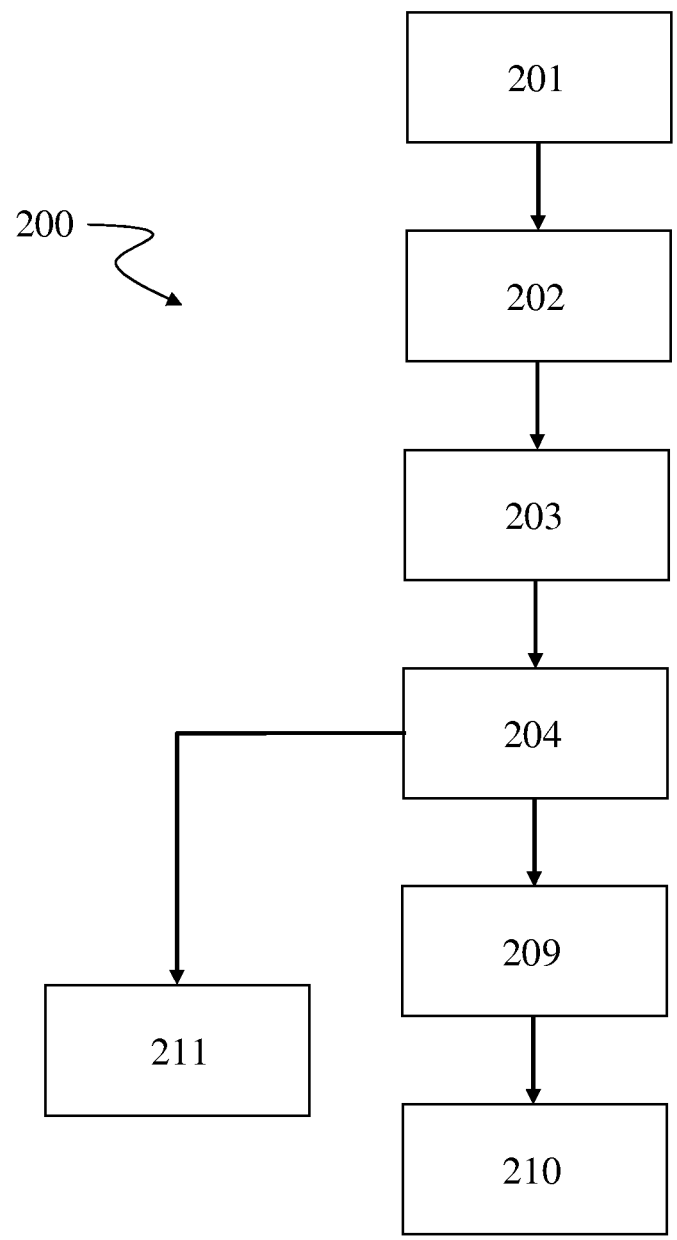
FIG. 12 is an exemplary block diagram depicting a method related to the electronic system of FIG. 3 according to the present disclosure.
Figure 13:
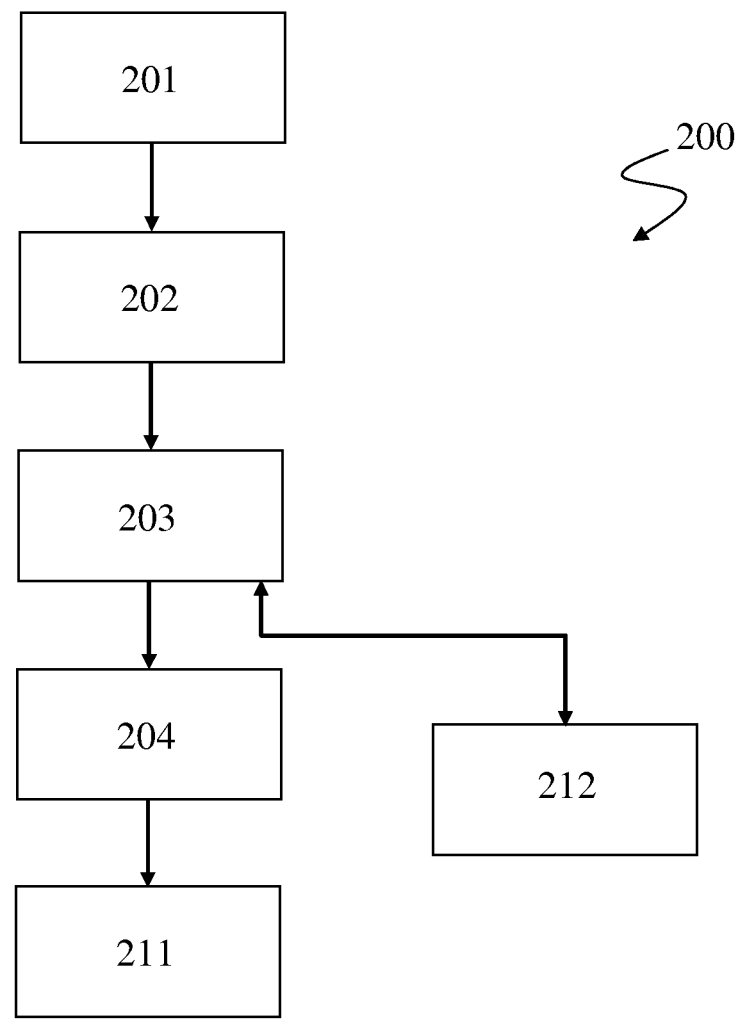
FIG. 13 is a block diagram depicting an exemplary method related the to electronic system of FIG. 4 according to the present disclosure.

With reference to FIGS. 3-7, the present disclosure is related to an electronic system 1 for an electrical apparatus, such as for example a control system 1 configured to execute control and/or power tasks on such electrical apparatus. With reference to FIGS. 12-13, a method 200 related to such control system 1 is disclosed.

The electronic system 1 includes at least a binary input 2 adapted (i.e., configured) to receive one or more candidate signals (indicated in the following description and related Figures with the reference "Sc"). For example, the binary input 2 is adapted to receive at least an electrical signal or command generated for being detected and validated by the electronic system 1, for example to cause the execution of one or more tasks of the electronic system 1. An example of such signal is the digital signal 501 shown in FIG. 1, which may be a command requesting a certain operation of the electrical apparatus associated to the electronic system 1.

Disturb or noise signals, such as the noise signal 500 shown in FIG. 1, can also be applied to the binary input 2 as candidate signals Sc; for example, the noise signal 501 can be generated due to electromagnetic or capacitive disturbances. Depending on its generating source, the noise signal can be repetitive or non-repetitive in time.

The electronic system 1 includes at least an electronic active load 50; e.g., an electronic load having one or more electronic active devices or components 51, which is operatively connected to the binary input 2 (step 201 of the method 200 according to the present disclosure). For example, the active load 50 is operatively connected to the associated binary input 2 and is adapted to be electrically driven in such a way to absorb energy from the candidate signal Sc applied to the binary input 2 by means of the active devices 51 provided therein.

According to an exemplary embodiment, the one or more electronic active devices 51 of the active load 50 are transistors 51. Non limiting examples of transistors 51 which can be used in the active load 50 are MOSFETs (Metal Oxide Semiconductor Field Effect Transistors), or BJTs (Bipolar Junction Transistors), or IGBTs (Insulated Gate Bipolar Transistors), or JFETs (Junction Field Effect Transistors), or OptoMOS, or Phototransistors.

The electronic system 1 includes control means 100 which are operatively associated to the binary input 2 and to the active load 50 and which are adapted to detect the application of the candidate signal Sc to the binary input 2 (step 202 of the method 200), electrically drive the active load 50 upon such detection, so as the active load 50 absorbs at least a predetermined amount of validation energy Ev from the candidate signal Sc (step 203 of the method 200), validate the candidate signal (Sc) after the absorption of said predetermined amount of energy (Ev), if its residual content of energy exceeds a predetermined threshold, hereinafter indicated as "validation threshold" (step 204 of the method 200).

The predetermined amount of validation energy Ev to be absorbed by the active load 50 is a parameter, for example a configurable parameter, set in the control means 100.

To validate the candidate signal, through a validation operation, means verify the validity of the candidate signal Sc, so as to discriminate a valid signal generated for the electronic system 1, e.g. for causing the electronic system 1 to execute one or more of its task, from a noise or disturbance signal. For example, the validation operation is carried out by determining if the amount of energy associated to the candidate signal Sc is greater than the predetermined validation threshold.

For example, after the absorption of the amount of validation energy Ev set in the control means 100 (and accordingly absorbed by the active load 50) only a detected candidate signal Sc having a residual content of energy greater than the predetermined validation threshold can be recognized, through the validation operation, as a valid signal, while a candidate signal Sc having a residual content of energy less than the predetermined validation threshold cannot is not recognized through the validation operation as a valid signal. For example, if the noise signal has an associated energy less than the predetermined amount of validation energy Ev, it is completely eliminated by the absorption operation carried out by the active load 50, i.e. it residual content of energy is substantially null.

In an exemplary embodiment, the control means 100 themselves are adapted to execute the tasks of the electronic system 1 on the associated electrical apparatus, due to validated candidate signals Sc (step 211 of the method 200).

Further, the electronic means 100 are, for example, adapted to measure, directly or indirectly, an input voltage $V_{in}$ applied to the binary input 2, i.e. the voltage applied to input terminals 3 of such binary input 2 (see for example FIGS. 3-6).

According to an exemplary embodiment, the control means 100 are adapted to detect when the measured input voltage $V_{in}$ rises above a predetermined detection threshold $V_{th}$ (see for example FIG. 1); the rising of the measured voltage $V_{in}$ above the detection threshold $V_{th}$ corresponds to the detection of the application of a candidate signal Sc to the binary input 2.

According to an exemplary embodiment, the control means 100 are adapted to compare the measured voltage $V_{in}$ associated to the detected candidate signal Sc with a threshold (indicative of the validation threshold of energy set to validate the signal Sc), in order to perform the validation operation on such candidate signal Sc after the absorption of the predetermined amount of validation energy Ev.

For instance, the threshold associated to the measured voltage $V_{in}$ can be equal to the detection threshold $V_{th}$.

If the measured voltage $V_{in}$ is above the associated threshold (i.e. if the residual content of energy of the candidate signal Sc after the absorption by the active load 50 is above the predetermined validation threshold of energy), the candidate signal Sc is validated and the electronic system 1 can accordingly execute one or more tasks.

If the measure voltage $V_{in}$ is below the associated threshold (e.g., if the residual content of energy of the candidate signal Sc after the absorption by the active load 50 is below the associated predetermined validation threshold of energy), the candidate signal Sc is detected as a noise signal and no tasks are executed by the electronic system 1 due to the generation of such noise.

According to an exemplary embodiment, the control means 100 are advantageously adapted to electrically drive the active load 50 so as to continue absorbing energy from the candidate signal Sc during at least the time allotted or required for performing the validation of such candidate signal Sc, time which hereinafter is indicated as "validation time $T_V$". Accordingly, the step 204 of the method 200 includes electrically driving the active load 50 so as to continuously absorbing energy from the candidate signal Sc after the absorption of the predetermined amount of validation energy Ev.

In this way the control means 100 are suitable for correctly performing the validation operation on the candidate signal Sc, even if such candidate signal Sc is a repetitive noise signal. In fact, if the control means 100 can completely stop the energy absorption from the repetitive noise signal after the absorption of the predetermined amount of validation energy Ev, during the following validation operation the energy of the noise under validation may suddenly increases due to its repetitive behavior, annulling the effects of the previous energy absorption and altering the result of the validation. For example, during the absorption of the predetermined amount of validation energy Ev, the energy of the repetitive noise signal falls below the associated validation threshold, but can rise again above such threshold during the validation operation (due to its repetitive behavior).

By continuing the energy absorption from the repetitive noise even during the validation time $T_V$, a sudden increase of the energy of such signal is prevented, guaranteeing a correct validation.

According to an exemplary embodiment, the control means 100 are adapted to electrically drive the associated active load 50 after the detection of the candidate signal Sc so as to absorb from such candidate signal Sc a predetermined amount of power $P_D$ during a predetermined time period $T_D$, in order to absorb the predetermined amount of validation energy Ev (given by the product of such amount of power $P_D$ and time $T_D$). For example, the predetermined amount of power $P_D$ and time period $T_D$ are parameters, for example, configurable parameters, set in the control means 100 according to the predetermined amount of validation energy Ev to be absorbed by the active load 50.

Accordingly, in the step 203 of the method 200 absorbing the predetermined amount of validation energy Ev from the candidate signal Sc includes absorbing from such candidate signal Sc the predetermined amount of power $P_D$ during the predetermined time $T_D$.

The control means 100 are adapted to electrically drive the associated active load 50 so as such active load 50 generates a dissipation current $I_D$ flowing therethrough during the predetermined time $T_D$. For example, the control means 100 are adapted to electrically drive each active device 51 provided in the active load 50 upon the detection of application of the candidate signal Sc to the binary input 2, so as each active device 51 generates a current flowing therethrough. The overall dissipation current $I_D$ of the active load 50 is given by all the currents generated by the active devices 51 provided in the active load 50.

The active load 50 is connected to the binary input 2 in such a way to draw from the candidate signal Sc applied to the binary input 2 the supply voltage $V_{supply}$ for generating the overall dissipation current $I_D$. Therefore, the amount of power absorbed by the active load 50 during the predetermined time $T_D$ is substantially given by the product between the dissipation current $I_D$ and the voltage supply $V_{supply}$ drawn by the candidate signal Sc, wherein the value of the dissipation current $I_D$ (and hence the value of the current flowing in each active device 51) is set by the control means 100 according to the set predetermined amount of power $P_D$ and the voltage supply $V_{supply}$.

Figure 7:
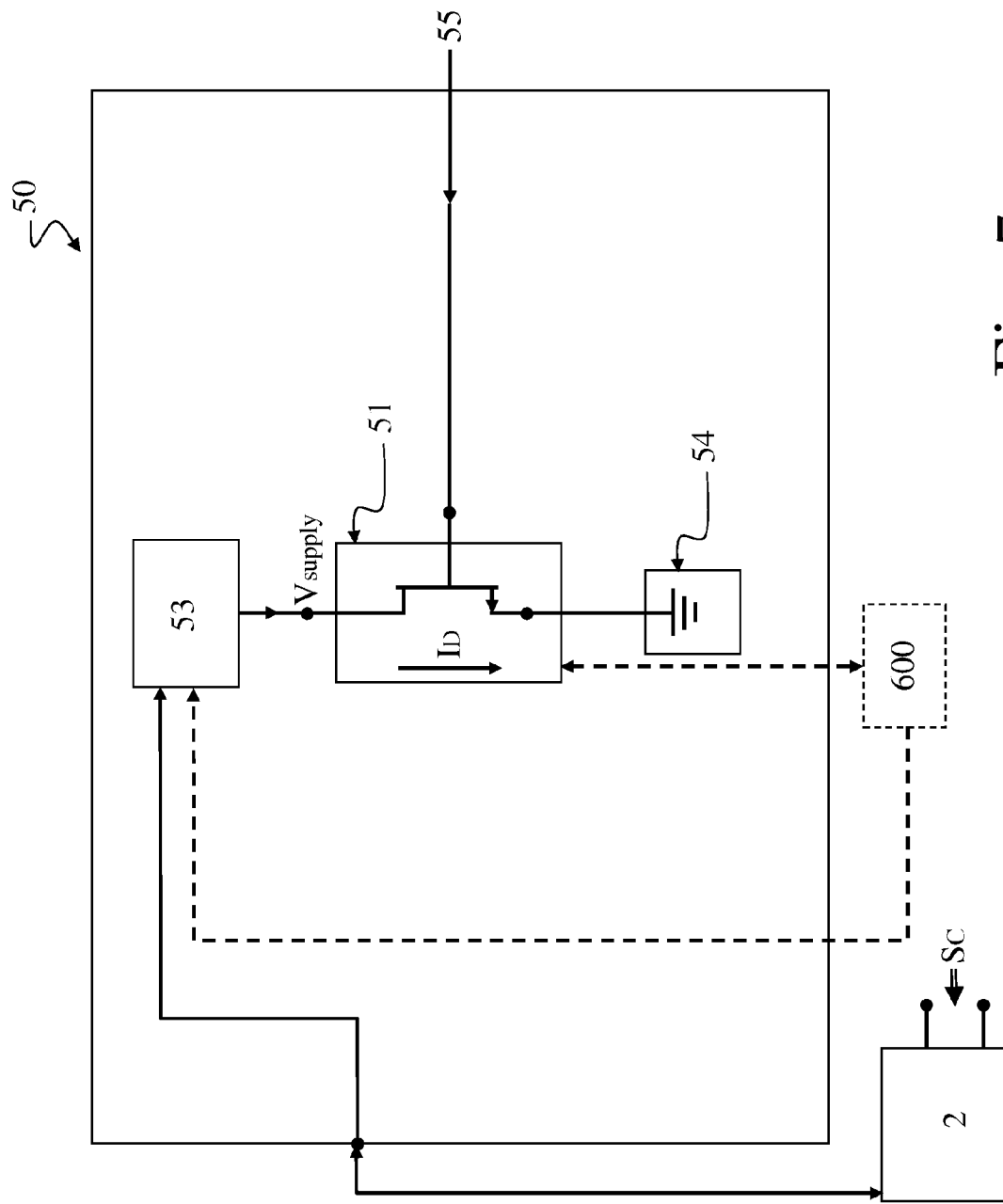
FIG. 7 is an exemplary block diagram which schematically shows the components of an electronic active load suitable for being used in an electronic system according to the present disclosure.

In the exemplary embodiment of FIG. 7, the active load 50 can include a MOSFET 51, in particular an n-MOSFET 51, a voltage supply circuit 53 and an electrical earth 54 which are electrically connected to the drain terminal and the source terminal, respectively, of such MOSFET 51.

The gate terminal of the MOSFET 51 is connected to the control means 100 so as to receive therefrom a driving signal 55 which is generated for causing the flowing in the MOSFET 51 of a current corresponding to the dissipation current $I_D$ of the active load 50.

The voltage supply $V_{supply}$ to generate such dissipation current $I_D$ is drawn from the candidate signal Sc and provided to the MOSFET 51 through the voltage supply circuit 53. The amount of power absorbed by the active load 50, in particular by the MOSFET 51, during the predetermined time period $T_D$ is substantially given by the product between the dissipation current $I_D$ and the voltage supply $V_{supply}$, wherein the value of the dissipation current $I_D$ is set by the driving signal 55 from the control means 100 according to the set predetermined amount of power $P_D$ and the voltage supply $V_{supply}$ drawn by the candidate signal Sc.

For example, in order to continue absorbing energy from the candidate signal Sc during the validation time $T_V$, the control means 100 are adapted to electrically drive the active load 50 so as to continue absorbing the predetermined amount power $P_D$ from the candidate signal Sc during the validation time $T_V$. For example, the control means 100 are adapted to electrically drive each active device 51 of the active load 50 so as the active load 50 continues generating the dissipation current $I_D$ during the validation time $T_V$. In this way, it can be guaranteed a correct validation operation on the candidate signal Sc, even if such candidate signal Sc is a repetitive noise signal.

In an exemplary embodiment, the control means 100 of the electronic system 1 according are adapted to control the amount of power absorbed from the candidate signal Sc by the active load 50 during the predetermined time period $T_D$, so as to keep such absorbed power at the value of the predetermined amount of power $P_D$ set in the control means 100.

For example, the control means 100 are adapted to measure, directly or indirectly, at least an electrical parameter of the candidate signal Sc applied to the binary input 2 and to control the dissipation current $I_D$ generated in the active load 50 during the predetermined time $T_D$ in order to absorb the set predetermined amount of power $P_D$. The set-point value $I_{set-point}$, (i.e., the target value for the control operation), of the dissipation current $I_D$ is calculated using the measured at least an electrical parameter of the candidate signal Sc.

Accordingly, the step 203 of the method 200 includes measuring at least an electrical parameter of the candidate signal Sc and controlling the dissipation current $I_D$ generated in the active load 50 during the predetermined time $T_D$, wherein controlling the dissipation current $I_D$ includes calculating a set-point value $I_{set-point}$ of the dissipation current $I_D$ using the measured at least an electrical parameter.

For example, the control means 100 can be advantageously adapted to calculate the set-point value $I_{set-point}$ of the dissipation current $I_D$ using the measured actual voltage $V_{in}$ of the candidate signal Sc applied to the binary input 2, wherein the control means 100 are already adapted to measure the input voltage $V_{in}$ applied to the binary input 2, so as to perform the detection and the validation of the candidate signal Sc, as previously disclosed.

In an exemplary embodiment, since the supply voltage $V_{supply}$ drawn from the candidate signal Sc by the active load 50 for generating the dissipation current $I_D$ is associated to the measured actual voltage $V_{in}$ of such signal Sc (e.g., it corresponds to or depends on the measure voltage $V_{in}$), the set point-value $I_{set-point}$ can be easily computed by the control means 100 using the measured actual voltage $V_{in}$ and the set predetermined amount of power $P_D$ to be absorbed.

Figure 15:
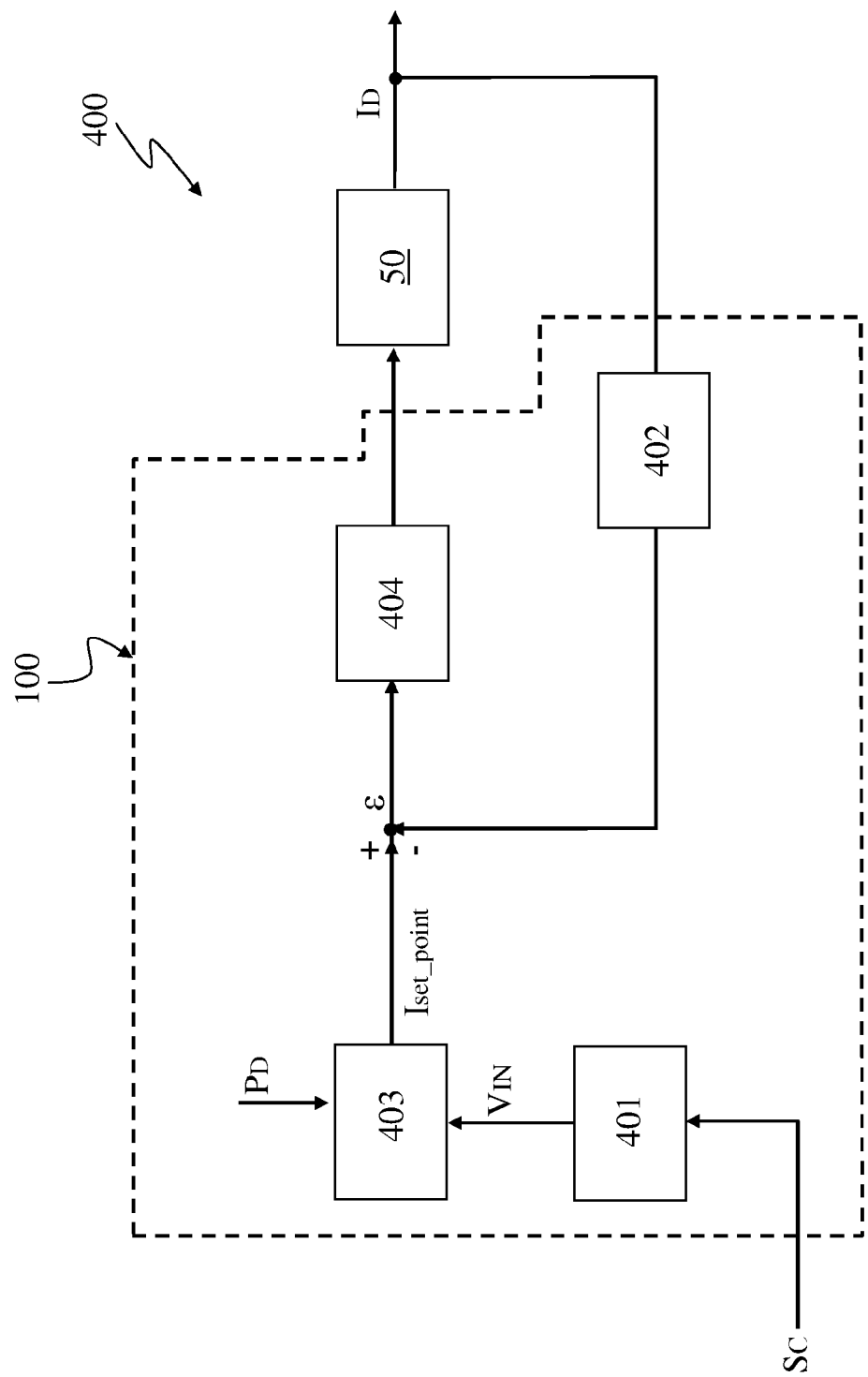
FIG. 15 is an exemplary block diagram showing a control scheme suitable for controlling the absorption operation of an active load of an electronic system according to the present disclosure.

FIG. 15 shows an exemplary current control scheme 400 suitable for being implemented by the control means 100. For example, the control means 100 are adapted to measure the voltage $V_{in}$ of the candidate signal Sc through measuring means schematically illustrated by the block 401, and to measure the dissipation current $I_D$ of the active load 50 through measuring means schematically illustrated by the block 402.

The control means 100 includes calculating means schematically illustrated by the block diagram 403 which compute the actual set point value $I_{set-poin}$ of the dissipation current $I_D$ using the measured actual voltage $V_{in}$ and the set predetermined amount of power $P_D$.

The control loop includes a controller 404 implemented by the control means 100 and schematically illustrated by the block diagram 404, wherein such controller 404 electrically drives the associated active load 50 so as to minimize the error E between the calculated actual set point value $I_{set-value}$ and the measured actual value of the dissipation current $I_D$ flowing in the active load 50.

For example, assuming that the active load 50 inserted in the control loop of FIG. 15 is the active load 50 illustrate in FIG. 7, the controller 404 is adapted to generate the driving signal 55 for the MOSFET 51 so as to minimize the error E.

Figure 3:
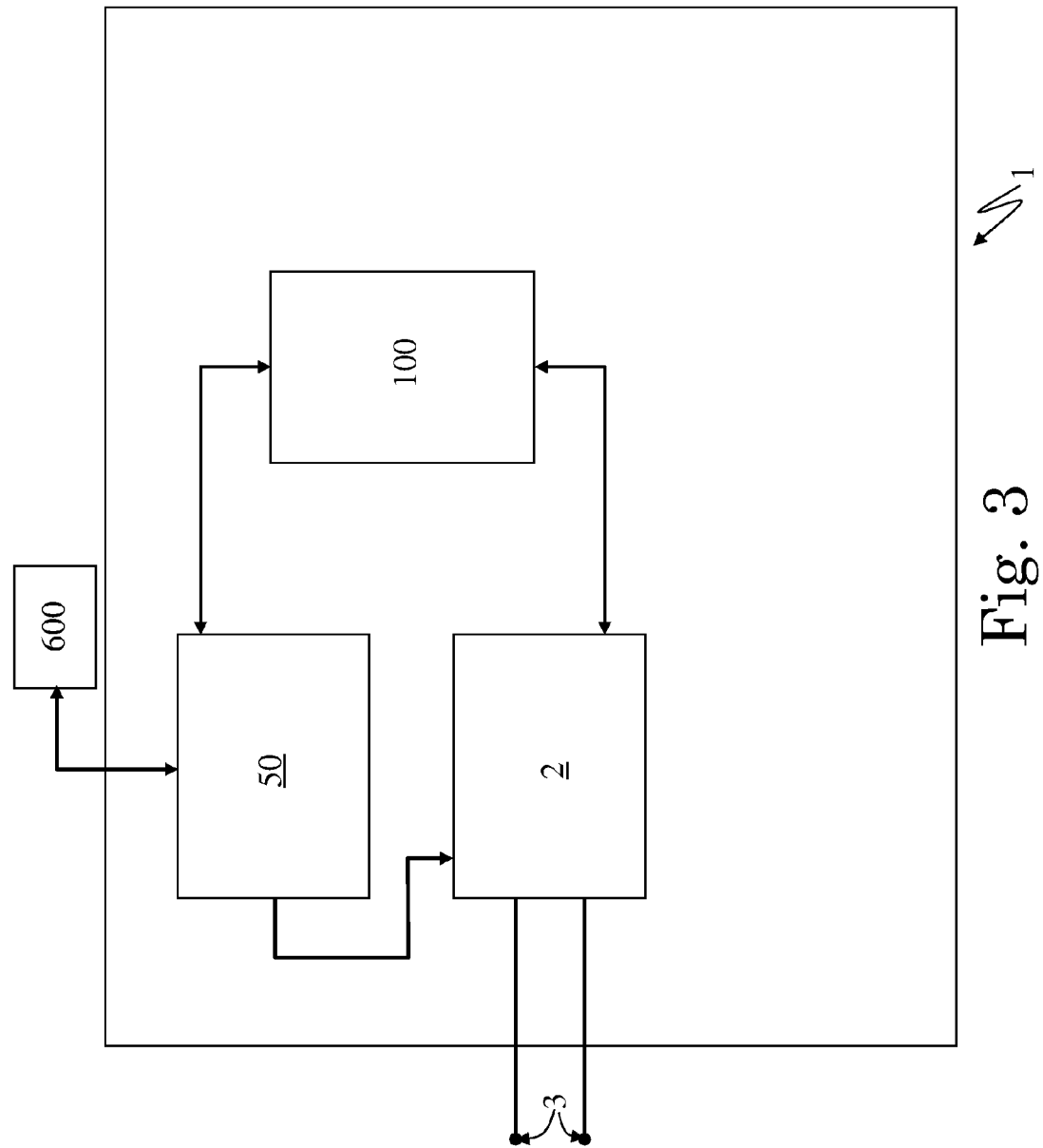
FIGS. 3 and 4 are exemplary block diagrams illustrating a first possible electronic system and a second possible electronic system, respectively, according to the present disclosure.

According to the exemplary embodiment of FIG. 3, the binary input 2 and the associated active load 50 of the electronic system 1 are placed in the same electronic circuit, e.g. they are mounted on or integrated in the same electronic boar 1000. FIG. 12 shows a block diagram depicting the method 200 related to the operation of such control system 1.

The control means 100 are also placed in the same circuit of the associated binary input 2 and active load 50 (in the example of FIG. 3 they are mounted on or integrated in the same electronic board 1000) and, therefore, they are able to control such binary input 2 and active load 50 according to the above description in an integrate and coordinate way.

Figure 4:
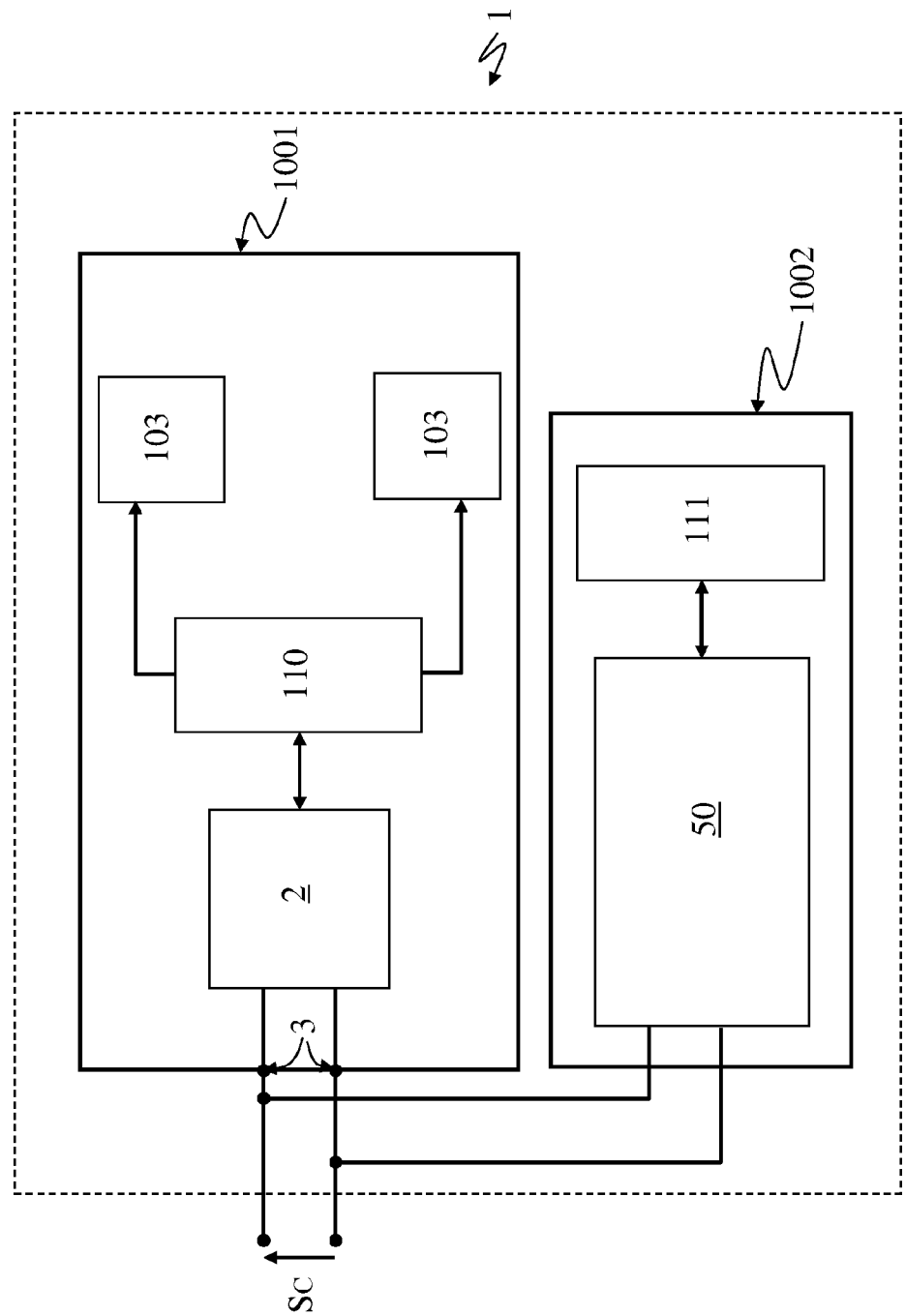
Figure 5:
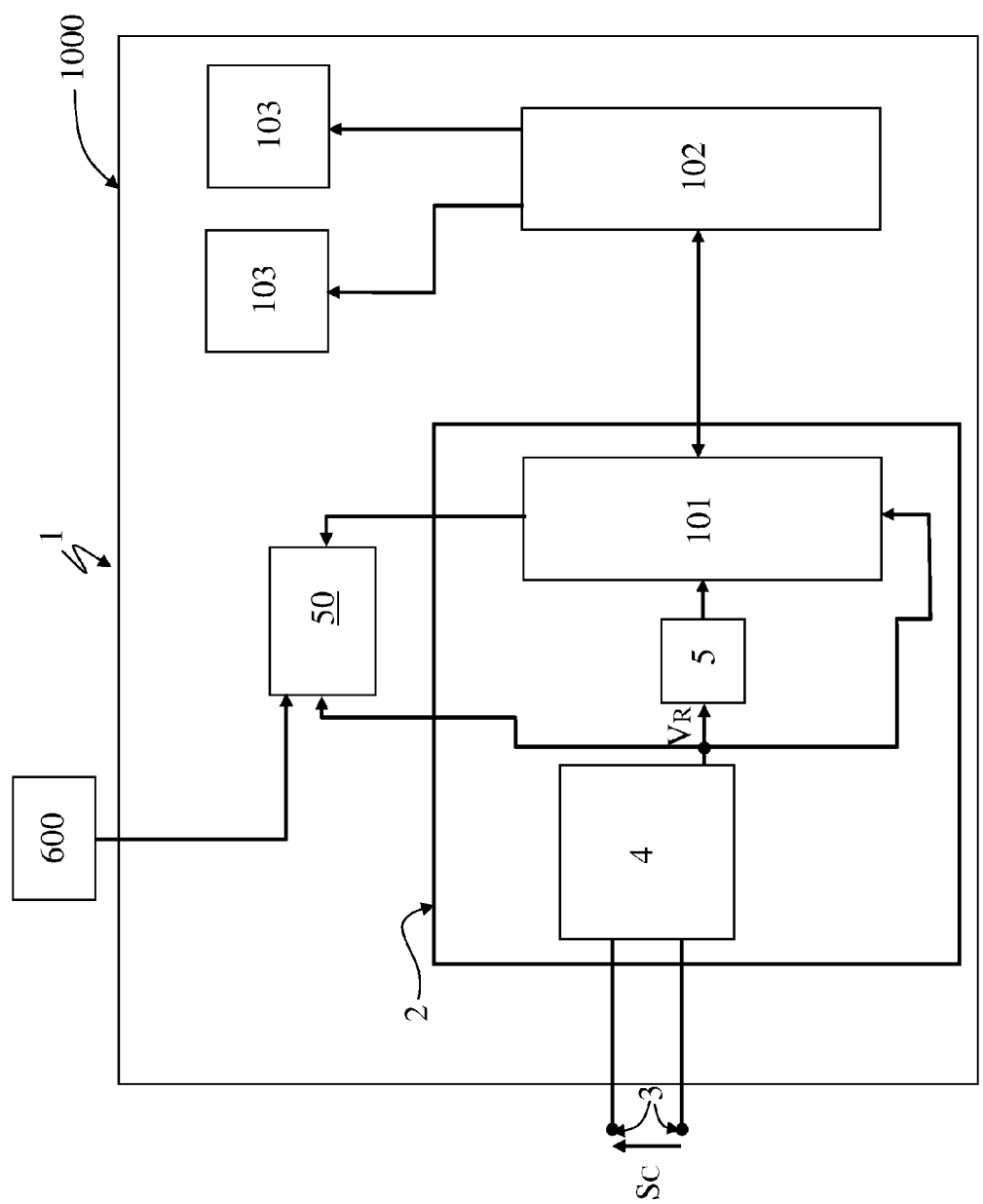
FIGS. 5 and 6 are exemplary block diagrams depicting a first embodiment and a second embodiment, respectively, of the electronic system in FIG. 3.
Figure 6:
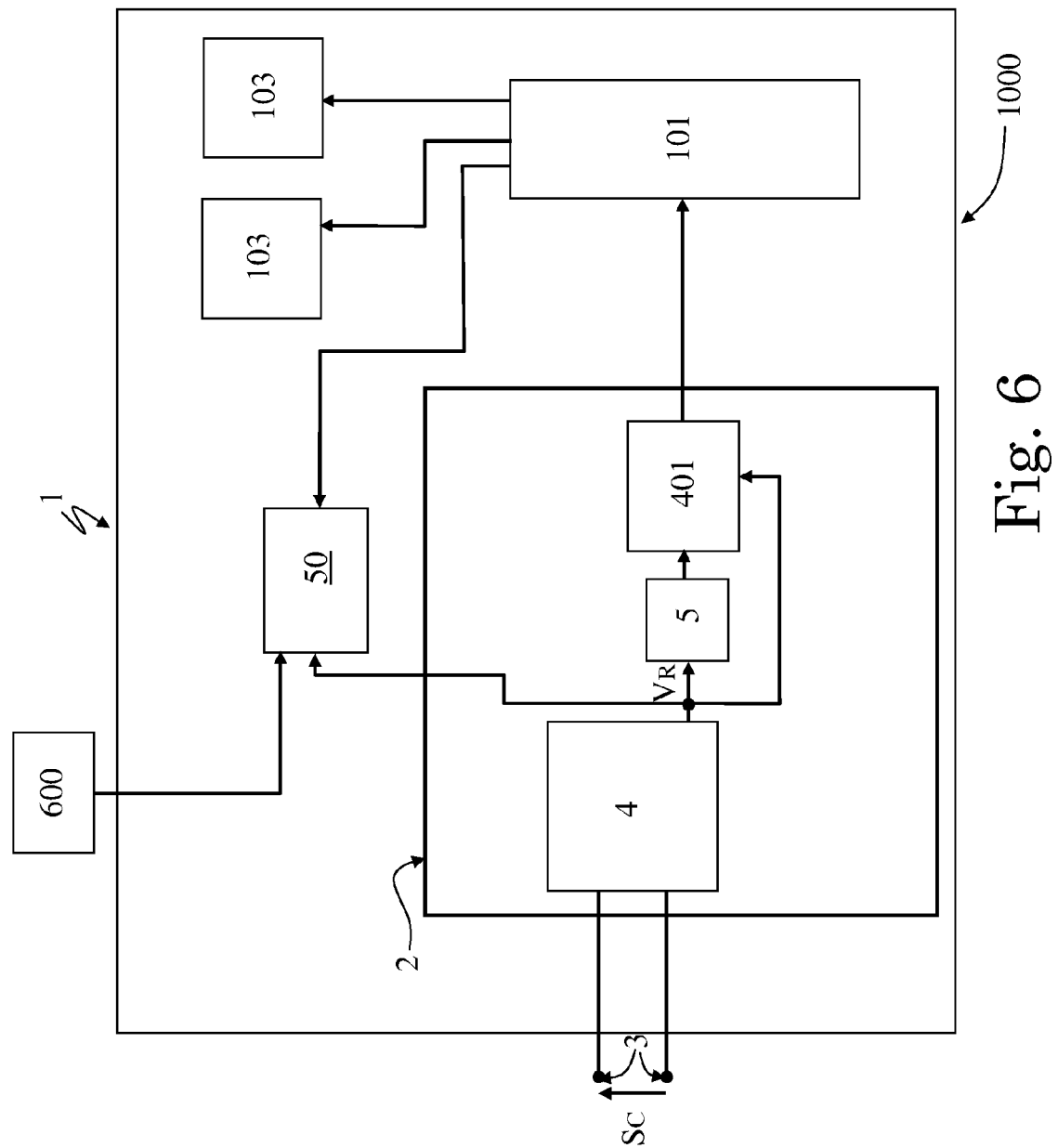

The electronic system 1 illustrated in FIG. 5 and the electronic system 1 illustrated in FIG. 6 are two exemplary embodiments of the control system 1 illustrated in FIG. 4. According to such exemplary embodiments, the control means 100 illustrated in FIG. 4 includes a control unit 101 adapted to integrate all the logic required to control the associate active load 50 and binary input 2, according to the previous disclosure.

Alternatively, the control means 100 illustrated in FIG. 3 can includes a plurality of control units, each adapted to perform specific tasks, wherein such control units are operatively connected and in communication each other to perform their specific tasks in a coordinate way.

In the exemplary embodiments of FIGS. 5-6, the binary input 2 includes at least a rectifying circuit 4 which is adapted to convert a received AC voltage signal in a DC voltage signal; in particular, the rectifying circuit 4 is connected to the input terminals 3 of the binary input 2 where the candidate signal Sc is applied. In this way the rectifying circuit 4 is suitable for receiving in input the voltage $V_{in}$ of the candidate signal Sc and for outputting a corresponding rectified voltage $V_R$. The active load 50 is connected to the output of the rectifying circuit 4 so as to drawn the voltage supply $V_{supply}$ to generate its dissipation current $I_D$ from the output voltage $V_R$.

In the exemplary embodiment of FIG. 5, the binary input 2 includes the control unit 101 which is connected to the output of the rectifying circuit 4 and is adapted to sense the rectified voltage $V_R$ so as to measure the voltage $V_{in}$ applied at the input terminals 3 of the binary input 2. The control unit 101 is adapted to detect the application of the candidate signal Sc to the binary input 2 and to control the dissipation current $I_D$ flowing in the active load 50 by using such measurement.

The control unit 101 is also connected to the rectifying circuit 4 through a circuit 5 arranged to adapt the output rectified voltage $V_R$ at a level required to supply the control unit 101. Therefore, the candidate signal Sc applied to the binary input 2 provides the control unit 101 with the power specified and/or required to operate.

In the exemplary embodiment of FIG. 5 the control means 100 illustrated in FIG. 4 further includes a main control unit 102 which is connected, for example, through galvanic insulation means, to the control unit 101 and which is adapted to execute the tasks (schematically represented in FIG. 5 with blocks 103) of the electronic system 1. Such tasks 103 are associated to the validated candidate signal Sc, wherein the validation is performed by the control unit 101.

In the exemplary embodiment of FIG. 6 the control means 100 illustrated in FIG. 4 includes a measuring circuit 401. The measuring circuit 401 is integrated in the binary input 2; for example, the measuring circuit 401 is connected to the output of the rectifying circuit 4 and is adapted to sense the rectified voltage $V_R$ so as to measure the voltage $V_{in}$ applied at the input terminals 3 of the binary input 2.

The measuring circuit 401 is also connected to the rectifying circuit 4 through a circuit 5 adapted to adapt the output rectified voltage $V_R$ at a level required to supply the measuring circuit 401. Therefore, the candidate signal Sc applied to the binary input 2 provides the measuring circuit 401 with the power specified or required to operate.

The control unit 101 is connected, for example, preferably through galvanic insulation means, to the measuring circuit 401 so as to receive in input the measured voltage $V_{in}$ and it is adapted to detect the application of the candidate signal Sc to the binary input 2 and to control the dissipation current $I_D$ of the active load 50 using such received measurement.

Further, the control unit 101 in FIG. 6 is adapted to execute the tasks (schematically represented with blocks 103) of the electronic system 1 which are associated to the validated candidate signal Sc, wherein the validation performed by the control unit 101 itself.

The control means 100 of the electronic system 1 according to the exemplary embodiment of FIG. 3 are adapted to electrically drive the active load 50 so as the active load 50 continues absorbing the predetermined amount of power $P_D$ from the candidate signal Sc during the validation time $T_V$.

Further, the control means 100 are adapted to at least reduce the dissipation current $I_D$ in the active load 50 at the end of the validation operation of the candidate signal Sc (step 209 of the method 200 of FIG. 12).

According to a first solution, such control means 100 are adapted to interrupt the dissipation current $I_D$ generated into the active load 50 (e.g., to stop generating current in each active device 51 of the active load 50) at the end of the validation time $T_V$. In this way, as soon as the absorption of energy from the candidate signal Sc is not further desired, the dissipation current $I_D$ is interrupted by the control means 100, so as to stop the heating in the active load 50 generated by the flowing of such current $I_D$.

According to a second solution, the control means 100 are adapted to reduce the dissipation current $I_D$ generated in the active load 50 to a small predetermined holding current $I_H$, at the end of the validation time $T_V$. For example, as shown for example in FIGS. 3, 5-7, the active load 50 is configured to be operatively connected to monitoring and/or diagnostic means 600 which in turn are adapted to monitor and/or signal the status of such active load 50 and/or the one or more parts of the electric system 1, by using the holding current $I_H$ (step 210 of the method of FIG. 12).

For example, the monitoring and/or diagnostic means 600 are adapted to detect when the holding current $I_H$ falls below a predetermined current threshold, due to a failure, or fault, in the active load 50 or due to a specified critical, or failure, condition detected in one or more parts of the electronic system 1. Critical conditions can include conditions wherein one or more parts of the electronic systems are not working correctly, due for example to their failure or damaging.

For example, such critical condition in the electronic system 1 is detected by the control means 100 which accordingly electrically drive the active load 50 to at least reduce the holding current $I_H$ so as to fall below the current threshold. For example, the control means 100 electrically drives the active load 50 so as to interrupt the flowing of the holding current $I_H$ after the detection of a critical condition in the electronic system 1.

When the holding current $I_H$ falls below the associated current threshold, the monitoring and/or diagnostic means 600 provide an alarm signaling.

The active load 50 and the associated monitoring and/or diagnostic means 600 are connected each other in such a way that the power supply used to generate the holding current $I_H$ is drawn by the active load 50 from the monitoring and/or diagnostic means 600 themselves (see for example FIG. 7).

The monitoring and/or diagnostic means 600 may be mounted or integrated on the electronic board 1000 or may include one or more external devices connected to the electronic board 1000.

The control means 100 of the electronic system 1 according to the exemplary embodiment of FIG. 3 can be adapted to detect at least a critical operating condition of the active load 50 which occurs during the set predetermined time $T_D$ and which is due to the absorption of the set predetermined amount of power $P_D$ from the candidate signal Sc, change the set predetermined amount of power $P_D$ to be absorbed so as to stop the detected critical condition, and accordingly change the duration of the set predetermined time $T_D$ so as to absorb the desired predetermined amount of validation energy Ev from the candidate signal Sc.

The critical operating condition due to the absorption of the predetermined amount of power $P_D$ could be a condition of failure or non correct working of the active load 50, for example of the active devices 51 thereof.

Accordingly, the step 203 of the method of FIG. 12 can include detecting at least a critical operating condition of the active load 50 occurring during the set predetermined time $T_D$ and due to the absorption from the candidate signal Sc of the set predetermined amount of power $P_D$, changing the set predetermined amount of power $P_D$ to be absorbed from the candidate signal Sc so as to stop the detected critical condition, and accordingly changing the duration of the set predetermined time $T_D$ so as to absorb from the candidate signal Sc the desired validation energy Ev.

In practice, if the control means 100 detect a critical condition due for example to a predetermined amount of power $P_D$ set too high, the control means 100 themselves intervene reducing the predetermined amount of power $P_D$ of an amount specified or required to stop the detected critical condition.

The control means 100 accordingly increase the predetermined time $T_D$, wherein the amount of such temporal increasing is such that the active load 50 has absorbed the desired amount of validation energy Ev at the end of the increased time $T_D$.

According to an exemplary embodiment the control means 100 are adapted to monitor the heating in the active load 50 due to the generated dissipation current $I_D$ and to detect an overheating condition (due to a predetermined amount of power $P_D$ set too high), electrically drive the active load 50 so as to reduce such dissipation current $I_D$ (and hence the associated absorbed amount of power $P_D$) and stop the overheating condition, and accordingly increase the duration of the predetermined time $T_D$ so as to absorb the desired predetermined amount of validation energy Ev from the candidate signal Sc.

The overheating condition is for example a condition wherein the temperature reached in the active load 50 exceeds a predetermined threshold and is so high that may damage or cause the non-correct working of the active load 50, in particular of the active devices 51 thereof.

Figure 8:
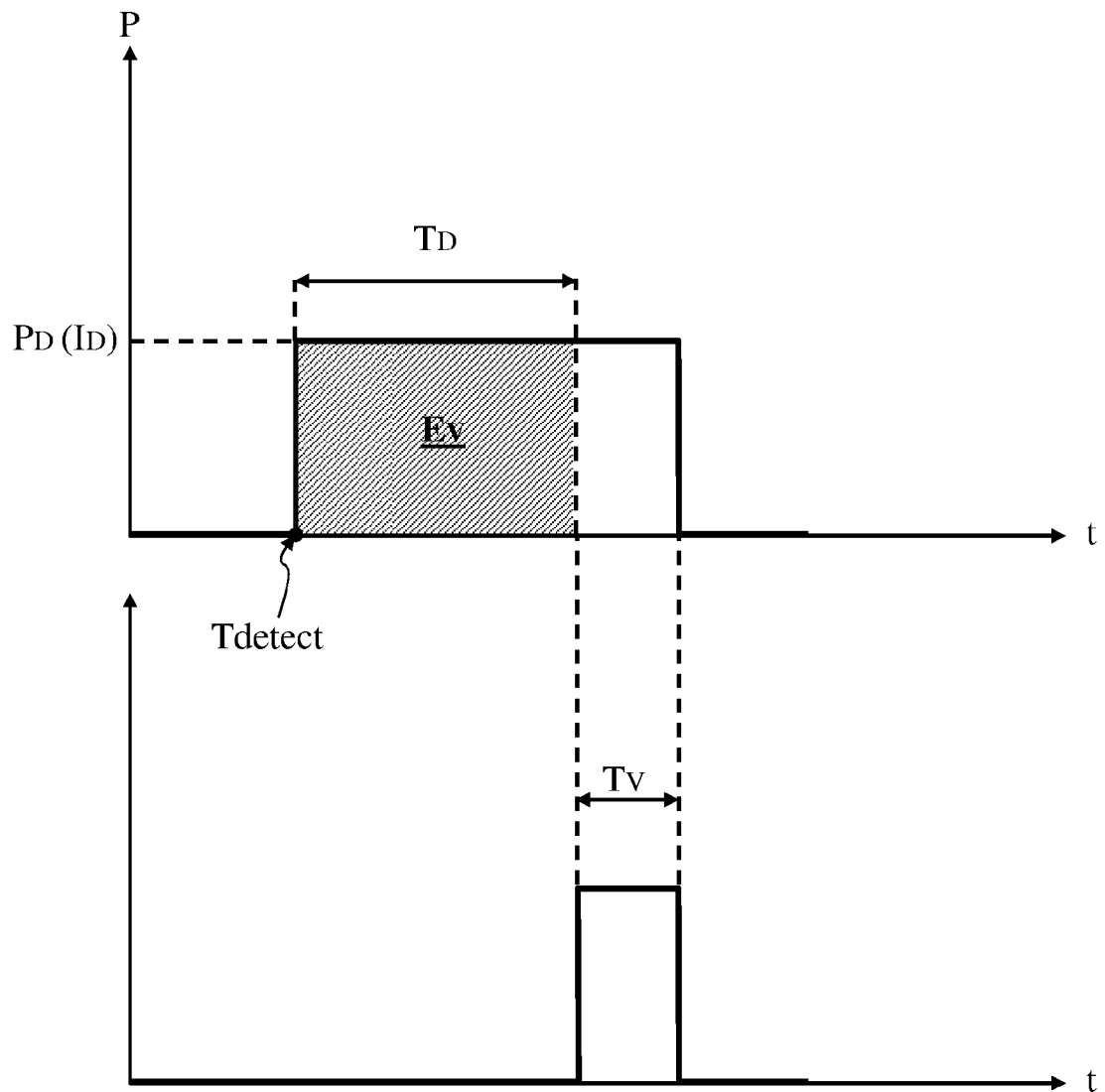
FIG. 8 shows through exemplary temporal graphics a first possible absorption operation and a consequent validation operation performed by the electronic system of FIG. 3 after the detection of the noise signal or the digital signal of FIG. 1.
Figure 9:
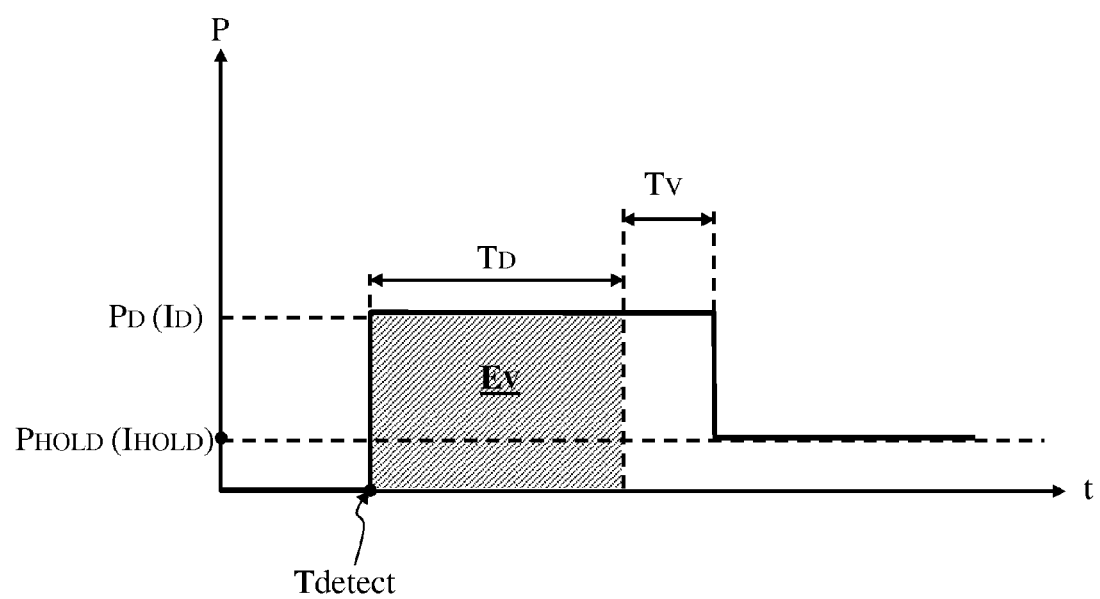
FIG. 9 shows through an exemplary temporal graphic a second possible absorption operation performed by the electronic system of FIG. 3 after the detection of the noise signal or the digital signal of FIG. 1.

With reference to FIGS. 8-9, the operation of the electronic system 1 illustrated in FIG. 3 is herein disclosed, considering the starting situation wherein a predetermined amount of validation Ev to be absorbed from the candidate signal Sc is set in the control means 100. For example, the predetermined amount of power $P_D$ and time $T_D$ are set in order to absorb from the candidate signal Sc the desired amount of validation energy Ev.

A candidate signal Sc, such as for example the digital signal 501 or the noise signal 500 illustrated in FIG. 1, is applied to the input terminals 3 of the binary input 2. The control means 100 measure the voltage $V_{in}$ applied to the input terminals 3 of the binary input 2, and detect the application of the candidate signal Sc basing on such measurement (step 202 of the method 200 in FIG. 12).

In FIGS. 1 and 8-9 such detection occurs at a detection time $T_{detect}$. For example, the control means 100 detects the application of the candidate signal Sc to the binary input 2 when the measured voltage $V_{in}$ rises above the associated detection threshold $V_{th}$, as illustrated in FIG. 1.

At the detect time $T_{detect}$ the control means 100 starts to electrically drive the active load 50 to absorb the predetermined amount of validation energy Ev from the candidate signal Sc applied to the binary input 2 (step 203 of the method of FIG. 12).

For example, the control means 100 start to electrically drive the active load 50 to absorb the predetermined amount of power $P_D$ from the candidate signal Sc (see FIGS. 8-9); e.g., the control means 100 start to electrically drive each active device 51 of the active load 50 so as to generated the dissipation current $I_D$ according to the set predetermined amount of power $P_D$ and the power supply $V_{supply}$ drawn from the candidate signal Sc, in order to generate such current $I_D$.

If the control means 100 do not detect any critical operating conditions occurring in the active load 50 during the predetermined time $T_D$, the control means 100 themselves electrically drive the active load 50 so as to continue absorb the set predetermined amount of power $P_D$ during the associated predetermined time $T_D$, as illustrated in FIGS. 8-9.

If the control means 100 detect such critical operating condition, they change the set predetermined amount of power $P_D$ to be absorbed, so as to stop the detected critical condition. Further, the control means 100 accordingly change the duration of the predetermined time $T_D$ so as to absorb the desired amount of validation energy Ev from the candidate signal Sc, even if the power absorption has been changed to stop the detected critical condition.

For instance, the control means 100 monitor the heating in the active load 50 due to the flowing of dissipation current $I_D$; if the control means 100 detect an overheating condition due to a predetermined amount of power $P_D$ set too high, they electrically drive the active load 50 so as to reduce such dissipation current $I_D$ (and hence the associated absorbed power $P_D$) and stop the overheating condition. Further, the control means 100 accordingly increase the duration of the predetermined time $T_D$ so as to absorb from the candidate signal Sc the desired predetermined amount of validation energy Ev, even if the power absorption has been reduced.

The control means 100 control the dissipation current $I_D$ generated in the active load 50 during the predetermined time $T_D$. For example, since the supply voltage $V_{supply}$ drawn by the active load 50 for generating the dissipation current $I_D$ is associated to the measured voltage $V_{in}$ of the candidate signal Sc, the set point-value $I_{set-point}$ of the dissipation current $I_D$ can be easily computed by the control means 100 using the measured actual voltage $V_{in}$ and the set predetermined amount of power $P_D$ to be absorbed. Hence, if the voltage $V_{in}$ decreases or increases during the predetermined time $T_D$, the dissipation current $I_D$ is accordingly increase or decreased by the control means 100, so as the active load 50 continues absorbing from the candidate signal Sc the set predetermined amount of power $P_D$.

As illustrated in FIGS. 8-9, at the end of the predetermined time $T_D$ the desired amount of validation energy Ev has been absorbed from the candidate signal Sc and the control means 100 validate the candidate signal Sc, by the validation operation, if its residual content of energy exceeds the predetermined validation threshold (step 204 of the method 200 of FIG. 12). For example, the control means 100 electrically drive the active load 50 so as to continue absorbing the predetermined amount of power $P_D$ from the candidate signal Sc (see FIGS. 8-9) during the validation time $T_V$.

For example, the control means 100 compare the voltage of the candidate signal Sc from which has been absorbed the predetermined amount of validation energy Ev with the associated detection threshold $V_{th}$ (corresponding to the predetermined validation threshold of energy of the validation operation). If the candidate signal Sc exceeds such threshold $V_{th}$, it is validated, i.e. detected as a valid signal generated for causing the execution of one or more tasks 103 of the electronic system 1. Otherwise, the candidate signal Sc is detected as a noise or disturb, and no tasks 103 are executed.

At the end of the validation time $T_V$, the control means 100 electrically drive the active load 50 so as to at least reduce the dissipation current $I_D$ (step 209 of the method 200 of FIG. 12). For example, according to the example of FIG. 8, the control means 100 can electrically drive the active load 50 so as to interrupt the dissipation current flowing therethrough.

According to the example of FIG. 9, the control means 100 can electrically drive the active load 50 so as to reduce the dissipation current $I_D$ flowing therethrough to the predetermined small holding current $I_H$ (corresponding to the dissipated power $P_H$ in FIG. 9). According to such example, the monitoring and/or diagnostic means 600 connected to the active load 50 supply the active load 50 itself to generate the holding current $I_H$ and use such holding current $I_H$ to monitor and/or signal the status of the active load 50 (step 210 of the method of FIG. 12).

According to the exemplary embodiment of FIG. 4, the binary input 2 and the associated active load 50 of the electronic system 1 can be placed in different electronic boards or circuits. FIG. 13 shows a block diagram depicting the method 200 related to the operation of such control system 1.

The electronic system 1 illustrated in FIG. 4 includes a first electronic board 1002 having at least the active load 50 mounted thereon or integrated thereto and a second electronic board 1001 having at least the binary input 2 mounted thereon or integrated thereto. The first and second electronic boards 1002, 1001 are associated by the electrical connection between the binary input 2 and the active load 50 (step 201 of the method of FIG. 13).

For example, the active load 50 is electrically connected to the binary input 2 so as to draw from the candidate signal Sc applied to the binary input 2 the supply voltage $V_{supply}$ for generating its dissipation current $I_D$, in order to absorb the predetermined amount of validation energy Ev from such signal Sc.

For example, the first and second electronic boards 1002, 1001 illustrated in FIG. 4 are associated one other through the electric connection between the active load 50 and the input terminals 3 of the binary input 2.

The control means 100 of such electronic system 1 comprise a first control unit 111 mounted or integrated in the first electronic board 1002 which is operatively associated to and control the active load 50, a second control unit 110 mounted on or integrated in the second electronic board 1001 which is operatively associated to the binary input 2 for validating the candidate signal Sc applied to the binary input 2.

Since the first and second electronic boards 1002, 1001 are associated only through the electric connection between the binary input 2 and the active load 50, the control units 110, 111 cannot communicate one other. Therefore, both the control unit 110 and the control unit 111 are adapted to detect the application of the candidate signal Sc to the binary input 2 (step 202 of the method 200 of FIG. 13), by measuring the input voltage $V_{in}$ applied to the input terminals 3 of the binary input 2.

The control unit 111 is adapted to electrically drive the active load 50 upon the detection of the application of the candidate signal Sc to the binary input 2, so as the active load 50 absorbs at least the predetermined amount of validation energy Ev from the candidate signal Sc (step 203 of the method 200 of FIG. 13).

For example, the control unit 111 is adapted to electrically drive the active load 50 upon the detection of the candidate signal Sc, so as to the active load 50 absorbs from the detected candidate signal Sc the predetermined amount of power $P_D$ during the predetermined time $T_D$ (see FIGS. 10-11), in order to absorb the desired amount of validation energy Ev.

The control unit 111 causes the absorption of the predetermined amount of power $P_D$ from the candidate signal Sc by electrically driving each active device 51 in the active load 50 so as to generate the overall dissipation current $I_D$, wherein the voltage supply $V_{supply}$ for generating such $I_D$ is drawn from the candidate signal Sc applied to the binary input 2.

The value of the dissipation current $I_D$ generated in the active load 50 (and hence the value of the current flowing in each active device 51) is set by the control means 100 according to the set predetermined amount of power $P_D$ and the voltage supply $V_{supply}$.

For example, the control unit 111 is adapted to control the dissipation current $I_D$ so as the active load 50 absorbs the set predetermined amount of power $P_D$ from the candidate signal Sc according to the voltage $V_{in}$ of the candidate signal Sc. For example, the control unit 111 is adapted to calculate the set-point value $I_{set-point}$ for the control of the dissipation current $I_D$, using the measured actual voltage $V_{in}$ of the candidate signal Sc and the set predetermined amount of power $P_D$ to be absorbed.

The electronic unit 110 associated to the binary input 2 is adapted to validate the candidate signal Sc after the absorption of the predetermined amount of validation energy Ev, if the residual content of energy of such candidate signal Sc exceeds the predetermined validation threshold (step 204 of the method 200 of FIG. 13). The control unit 110 of FIG. 4 is also adapted to execute the tasks of the electronic system 1 (schematically illustrated by the blocks 103) on the related electrical apparatus, if the candidate signal Sc is validated (step 211 of the method 200 of FIG. 13).

The control unit 111 is adapted to electrically drive the active load 50 so as to continue absorbing energy from the candidate signal Sc during the validation time $T_V$ required by the control unit 110 to perform the validation operation. In this way a correct validation can be guaranteed even if the candidate signal Sc applied to the binary input 2 is a repetitive noise.

The active load 50 and the associated control unit 111 can be for example implemented as an accessory for an electrical apparatus having already installed therein the second electronic board 1001. For example, the control unit 110 in such pre-installed electronic board 1001 is adapted to detect the application of the candidate signal Sc to the associated binary input 2 and to validate such detected candidate signal Sc after a time, hereinafter indicated as filtering time $T_F$, which is set long for guaranteeing the noise immunity of the system implemented through the pre-installed electronic board 1001 alone.

The second electronic board 1002 can be advantageously connected as an accessory to the pre-installed electronic board 1001, for example, by connecting the active load 50 to the input terminals 3 of the binary input 2 (step 201 of the method 200 of FIG. 13). The electronic boards 1001, 1002 are adapted to implement the electronic system 1 according to the present disclosure after their connection.

If the control unit 110 of the pre-installed electronic board 1001 is suitable for being configured by an operator to change the duration of the filtering time $T_F$, such operator sets in the control unit 111 the desired amount of validation energy Ev to be absorbed from the candidate signal Sc by the active load 50, and accordingly reduce the filtering time $T_F$ set in the control unit 110 so as such control unit 110 validate the candidate signal Sc at the end of the absorption of the predetermined amount of validation energy Ev (see FIG. 11), if such candidate signal Sc has a residual content of energy exceeding the predetermined validation threshold.

In such case, the control unit 111 can be adapted to electrically drive the associated active load 50 so as to continue absorbing energy from the candidate signal Sc for a predetermined additional temporal interval $T_{add}$, after the absorption of the desired amount of validation energy Ev (step 212 of the method 200 in FIG. 13).

Figure 11:
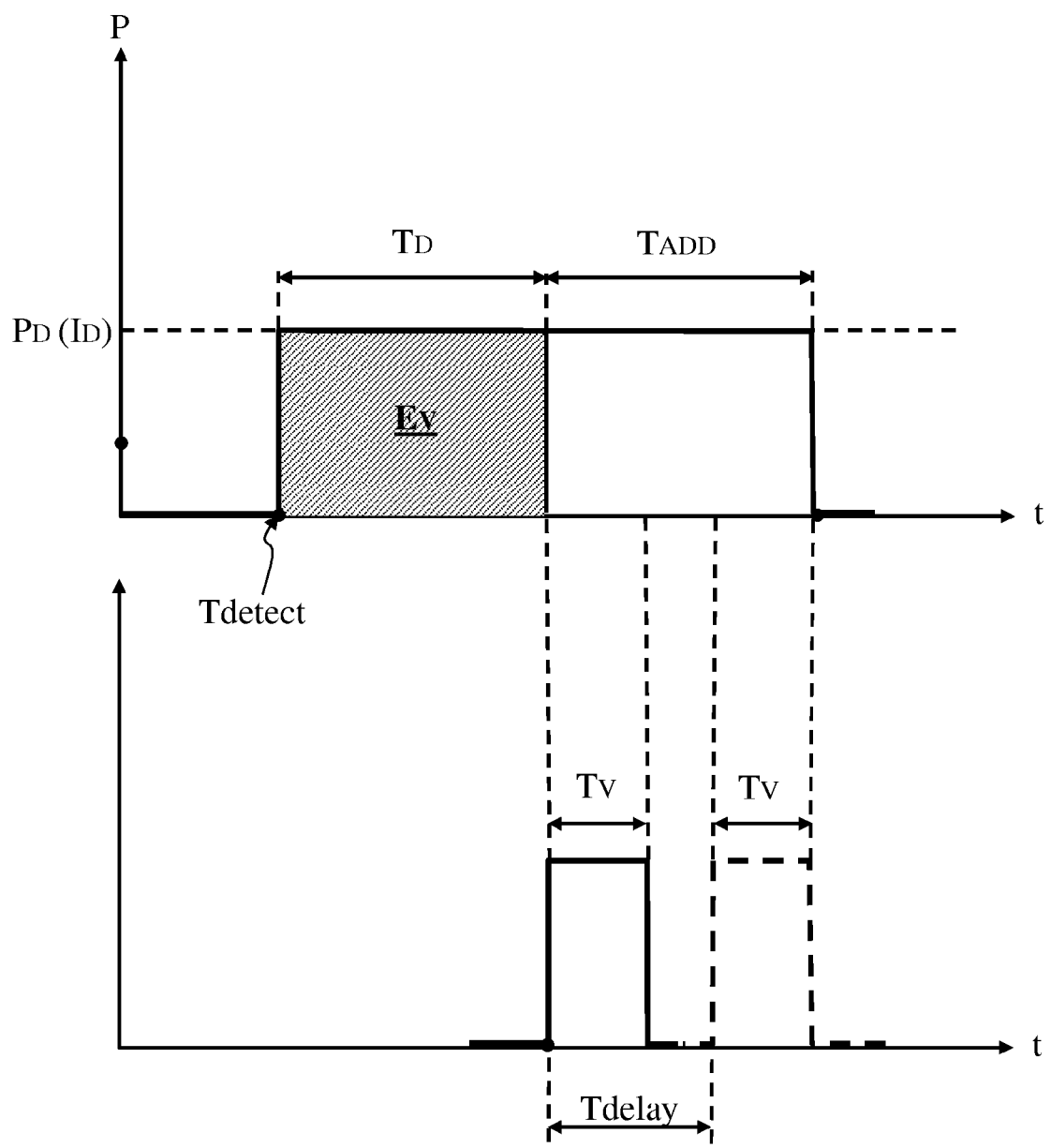
FIG. 11 shows through exemplary temporal graphics a second possible absorption operation and a consequent validation operation performed by the electronic system of FIG. 4 after the detection of the noise signal or the digital signal of FIG. 1.

For example, as illustrated in FIG. 11, the control unit 111 can be adapted to electrically drive the active load 50 during the additional temporal interval $T_{add}$ so as the active load 50 continues absorbing the predetermined amount of power $P_D$.

The additional time interval $T_{add}$ has a duration set by the operator to take care of possible temporal delays between the end of the absorption of the predetermined amount of validation energy Ev and the following validation of the candidate signal Sc, due for example to setting errors in the control unit 100 e/o the control unit 111. Hence, even if the control units 100, 111 cannot communicate one other to coordinate their operations, the additional time interval $T_{add}$ guaranteed that the active load 50 continues absorbing energy from the candidate signal Sc during a delayed validation operation of such signal Sc (see FIG. 11).

Figure 10:
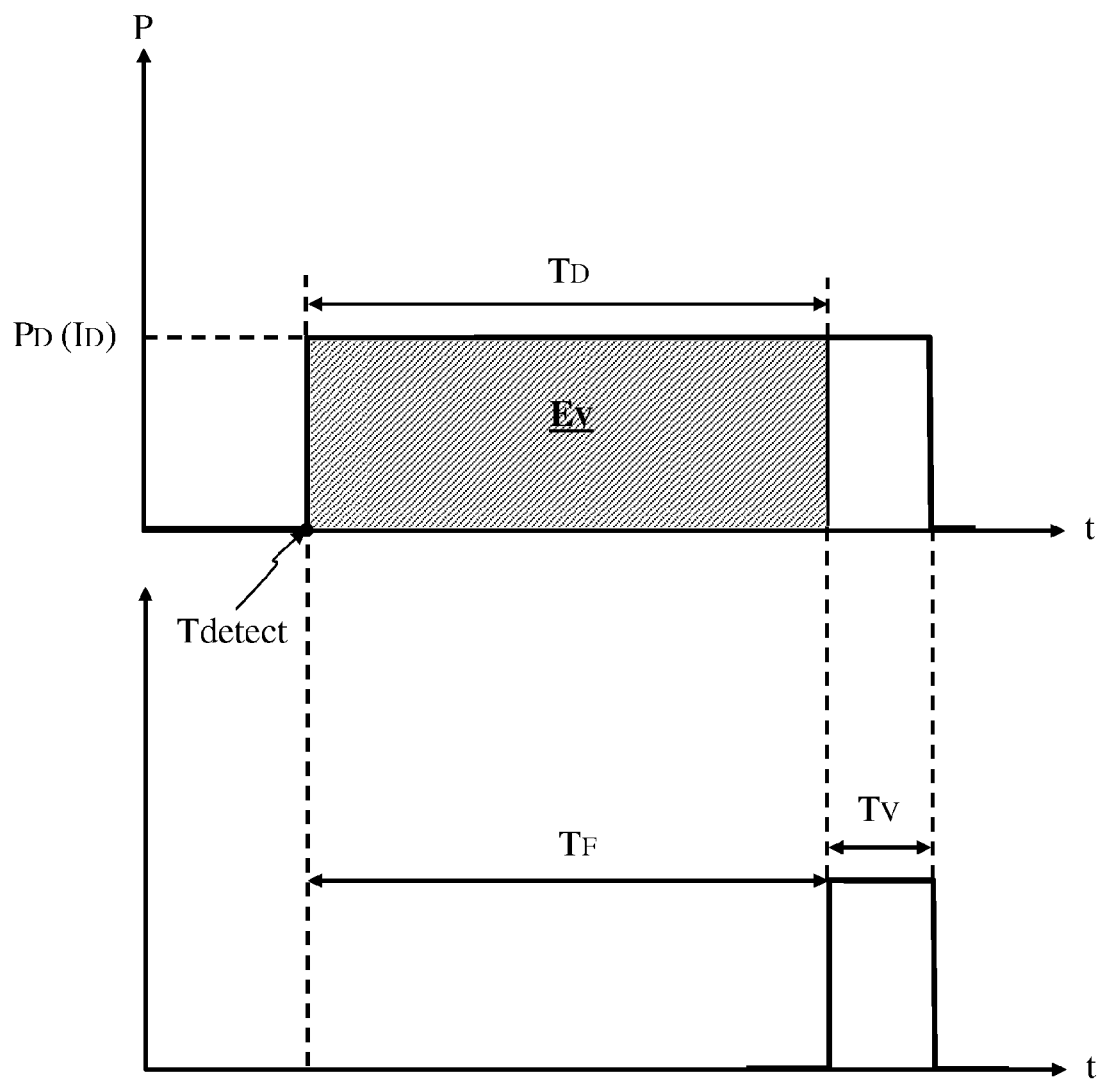
FIG. 10 shows through exemplary temporal graphics a first possible absorption operation and a consequent validation operation performed by the electronic system of FIG. 4 after the detection of the noise signal or the digital signal of FIG. 1.

If the control unit 110 of the pre-installed electronic board 1001 cannot be configured by an operator to change the duration of the set long filtering time $T_F$, the operator sets the control unit 111 so as to electrically drive the associated active load 50 to absorb the desired amount of validation energy Ev from the candidate signal Sc during the predetermined time $T_D$, wherein such predetermined time $T_D$ is set substantially equal to the filtering time $T_F$ of the control unit 110 (see FIG. 10).

With reference to FIGS. 10-11, the operation of the electronic system 1 illustrated in FIG. 4 is herein disclosed, considering the starting situation wherein an operator connects, as an accessory, the electronic board 1002 to the pre-installed electronic board 1001, by connecting the active load 50 to the input terminals 3 of the binary input 2 (step 201 of the method 200 illustrated in FIG. 13).

According to the example of FIG. 11, the operator sets in the control unit 110 a desired predetermined amount of validation energy Ev to be absorbed from the candidate signal Sc and accordingly reduces the filtering time $T_F$ set in the control unit 110, so as the validation of the candidate signal Sc starts at the end of the absorption of the predetermined amount of validation energy Ev.

According to the example of FIG. 10, the control unit 110 of the pre-installed electronic board 1002 cannot be configured and the operator sets the predetermined amount of validation energy Ev in the control unit 111 so as the predetermined time $T_D$ during which the predetermined amount of power $P_D$ its absorbed from the candidate signal Sc corresponds to the unchanged filtering time $T_F$.

A candidate signal Sc, such as for example the digital signal 501 or the noise signal 500 illustrated in FIG. 1, is applied to the input terminals 3 of the binary input 2. The control unit 111 measures the voltage $V_{in}$ of such candidate signal Sc and detects the application of the candidate signal Sc to the binary input 2 basing on such measurement (step 202 of the method 200 in FIG. 13). In FIGS. 1 and 10-11 such detection occurs at a detection time $T_{detect}$.

At the detect time $T_{detect}$ the control unit 111 100 starts to electrically drive the active load 50 to absorb the predetermined amount of validation energy Ev from the candidate signal Sc applied to the binary input 2 (step 203 of the method of FIG. 13).

For example, the control unit 111 starts to electrically drive the active load 50 to absorb the predetermined amount of power $P_D$ from the candidate signal Sc (see FIGS. 8-9), i.e. the control unit 111 starts to electrically drive each active device 51 of the active load 50, for generating the dissipation current $I_D$ according to the set predetermined amount of power $P_D$ and the power supply $V_{supply}$ drawn from the candidate signal Sc.

The control unit 111 controls the dissipation current $I_D$ generated in the active load 50 during the predetermined time $T_D$. For example, since the supply voltage $V_{supply}$ is associated to the voltage $V_{in}$ of the candidate signal Sc, the set point-value $I_{setpoint}$ of the dissipation current $I_D$ is computed by the control unit 111, using the measured actual voltage $V_{in}$ and the set predetermined amount of power $P_D$ to be absorbed.

Hence, if the voltage $V_{in}$ decreases or increases during the predetermined time $T_D$, the dissipation current $I_D$ is accordingly increase or decreased by the control unit 111 so as the active load 50 continues absorbing the set predetermined amount of power $P_D$ from the candidate signal Sc.

Also the control unit 110 detects the application of the candidate signal Sc to the binary input 2 at the detect time $T_{detect}$, by measuring the input voltage $V_{in}$ applied to the input terminals 3 of such binary input 2. The control unit 110 starts the validation operation at the end of the predetermined time $T_D$ (see FIGS. 10-11); in particular, the control unit 110 validates the candidate signal Sc if its residual content of energy exceeds the predetermined validation threshold.

In FIG. 11, the control unit 111 electrically drives the active load 50 to continue absorbing the predetermined amount of power $P_D$ after the end of the absorption of the predetermined amount of validation energy Ev, for the additional time interval $T_{add}$.

In this way, even if the validation operation is delayed by a certain $T_{delay}$ with respect to the end of the absorption of the predetermined amount of validation energy Ev, the active load 50 is still absorbing energy from the candidate signal Sc during the validation time $T_V$ of such delayed validation (see FIG. 11).

At the end of the additional time interval $T_{add}$ the control unit 111 electrically drive the active load 50 to at least reduce the dissipation current $I_D$ (in the example of FIG. 11 the dissipation current $I_D$ is interrupted).

In FIG. 10, the control unit 110 starts the validation operation at the end of the filtering time $T_F$ originally set therein (before the connection between the pre-installed electronic board 1001 and the accessory electronic board 1002), e.g., the control unit 110 validates the candidate signal Sc if its residual content of energy exceeds the validation threshold. The control unit 111 electrically drives the active load 50 to continue absorbing the predetermined amount of power $P_D$ from the candidate signal during the validation time $T_V$.

At the end of the validation time $T_V$ the control unit 111 electrically drives the active load 50 to at least reduce the dissipation current $I_D$ (in the example of FIG. 10 the dissipation current $I_D$ is interrupted).

The present disclosure is also related to the electrical apparatus including at least an electronic system 1 according to the present disclosure.

Figure 14:
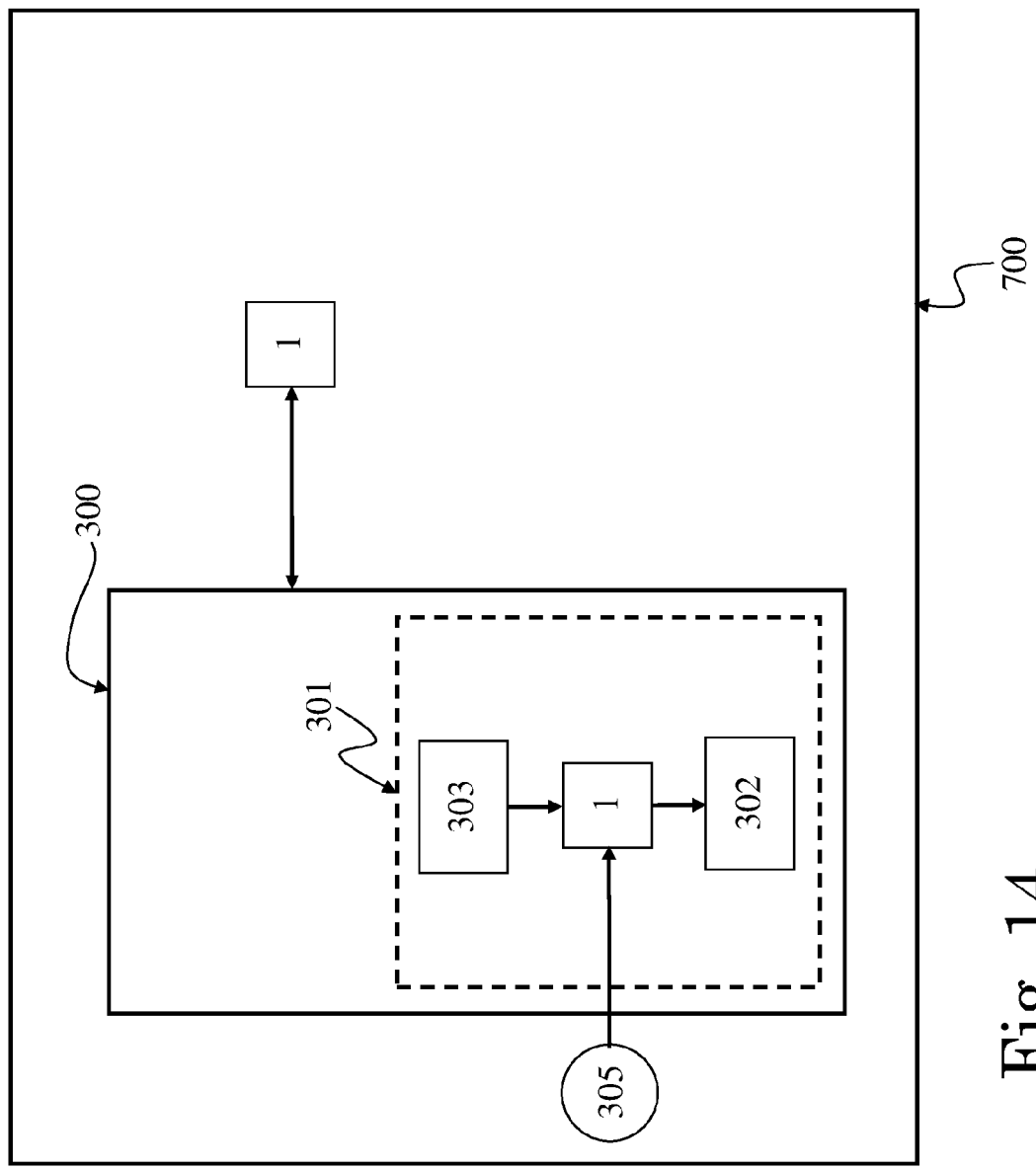
FIG. 14 is an exemplary block diagram which schematically illustrates a switchgear having at least a switching device and at least an electronic system according to the present disclosure.

According to the exemplary embodiment of FIG. 14, the electronic system 1 is suitable for being installed in a switching device 300, such as for example a circuit breaker 300 for a low or medium voltage circuit, and/or in the switchgear 700 where such switching device 300 is installed.

For instance, the electronic system 1 can be installed in the trip circuit 301 of the switching device 300, wherein such trip circuit 301 includes at least: an opening coil actuator 302 suitable for causing with its intervention the opening of the switching device 300; and means 303 for generating a trip command, such as for example the trip command 501 illustrated in FIG. 1, requesting the intervention of the coil actuator 302.

Such means 303 can comprise a protection device 303, or relay 303, which is configured for detecting a fault in the electric circuit where the switching device 300 is installed and for generating the trip command 501 upon the detection of such fault.

The electronic system 1 realizes the interface between the means 303 and the associated coil opening actuator 302; in particular, the binary input 2 receives the generated trip command 501 as a candidate signal Sc and, upon the validation of such command 501, the electronic system 1 electrically drives the coil actuator 302 to open the switching device 300.

A trip command 501 generated from means 305 outside the switching device 300 can also be sent by remote to the binary input 2, in order to cause, upon its validation, the opening of the switching device 300 through the coil actuator 302.

According to such exemplary embodiment, the predetermined amount of validation energy Ev to be absorbed from the candidate signal Sc applied to the binary input 2 by the active load 50 is preferably set in the control means 100 substantially equal to the energy required by the opening coil actuator 2 to operate and open the switching device 300.

In fact, as known, a disturb or signal, such as the noise signal 500 illustrated in FIG. 1, has not sufficient energy to operate the coil actuator 302 and open the switching device 300. Therefore, the control system 1 according to the present disclosure acts simulating such condition wherein a noise is applied to the coil actuator 302, because only the candidate signals Sc having an energy greater the predetermined amount of validation energy Ev (which is set equal to the energy required by the opening coil actuator 302 to operate) can have, after the energy absorption by the active load 50, a residual content of energy exceeding the validation threshold, in order to be validated by the electronic system 1.

The monitoring and/or diagnostic means 600 connected to electronic system according to the exemplary embodiments of FIGS. 3 and 5-6 can comprise at least a trip circuit supervisor "TCS" which is a well known device used in the trip circuit 301 of the switching devices 300 and therefore is not further disclosed herein.

In addition to the electronic system 1 installed in the trip circuit 301, the switching device can comprise other electronic systems 1, for example a control system 1 adapted to receive status information of the switching device 300, such a signal relative to the coupled or separated position of the contacts of the switching device 300 itself.

Further, one or more electronic systems 1 may be installed in the switchgear 700, outside the switching device 300, for performing several tasks on the electrical apparatuses 300 installed in the switchgear 700. For example, the electronic system 1 illustrate in FIG. 14 can be connected to the switching device 300 to receive therefrom or send thereto information or commands generated inside or outside the switchgear 700.

In practice, it has been seen how the control system 1 and the related method 20 according to the present disclosure allow achieving the intended object offering some improvements over known solutions.

For example, only a candidate signal Sc having a residual content of energy (after the absorption therefrom of the predetermined amount of validation energy Ev by the active load 50) exceeding the validation threshold energy can be validated for causing the execution of one or more tasks of the electronic system 1. Therefore, the noise immunity is increased in the electronic system 1.

Figure 2:
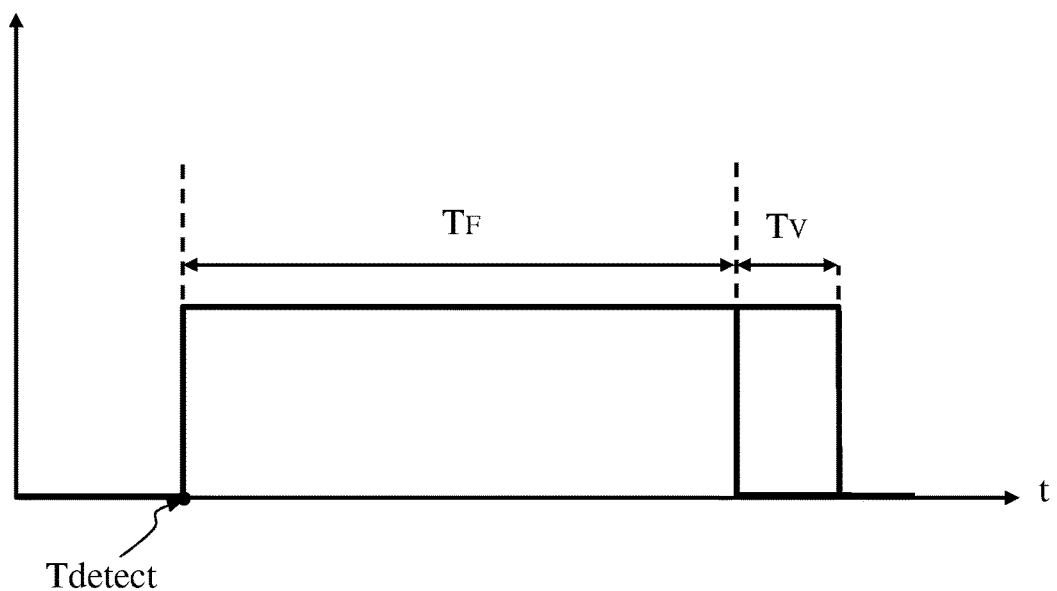
FIG. 2 shows a validation operation performed by an electronic system according to the state of the art upon the detection of the noise signal or the digital signal of FIG. 1.

Further, the predetermined time $T_D$ during which the predetermined amount of validation energy Ev is absorbed from the candidate signal Sc can be set shorter than the filtering time $T_F$ used in known solution to improve the noise immunity (see the example of FIG. 2). In such case, the electronic system 1 according the present disclosure is not only safer but also faster with respect known solutions.

The impedance associated to the electronic active load 50 can be dynamically controlled by the associated control means 100, for example for controlling the energy absorption operation of the active load 50 in view of the voltage of the candidate signal Sc or in view of critical operating conditions of the active load 50, such as an overheating condition.

Moreover, all parts/components of the electronic system 1 can be replaced with other technically equivalent elements; in practice, the type of materials, and the dimensions, can be any according to needs and to the state of the art.

The control unit 101 illustrated in FIGS. 5-6 or the control units 110, 111 illustrated in FIG. 4 can be any suitable electronic device adapted to: receive and execute software instructions, receive and generate input and output data and/or signals through a plurality of input and/or output ports. For example, such control units 101, 110, 111 may be: microcontrollers, microcomputers, minicomputers, a digital signal processors (DSPs), optical computers, complex instruction set computers, application specific integrated circuits, a reduced instruction set computers, analog computers, digital computers, solid-state computers, single-board computers, or a combination of any of theses.

For example, in the embodiment of FIG. 3 the binary input 2, the active load 50 and the control means 100 can be realized as a single electronic circuit, or unit, integrated in or mounted on the electronic board 1000.

For example, in the embodiment of FIG. 4, the binary input 2 and the associated control unit 110 can be implemented can be realized as a single electronic circuit, or unit, integrated in or mounted on the electronic board 1001; further, also the active load 50 and the associated control unit 111 can be realized as a single electronic circuit, or unit, integrated in or mounted on the electronic board 1002.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. An electronic system for an associated electrical apparatus, comprising:
   at least a binary input adapted to receive one or more candidate signals;
   at least an electronic active load having one or more electronic active devices and operatively connected to said binary input; and
   control means which are operatively associated to said binary input and to said active load, and which are configured to:
   detect application of a candidate signal to the binary input and electrically drive said active load upon said detection, such that the active load will absorb at least a predetermined amount of energy from the candidate signal; and
   after absorption of said predetermined amount of energy validate the candidate signal if its residual content of energy exceeds a predetermined threshold.

2. The system of claim 1, wherein said control means are configured to electrically drive said active load so as to continue absorbing energy from said candidate signal during at least a time for performing the validation of the candidate signal.

3. The system according to claim 1, wherein said control means are configured to electrically drive the active load to absorb from said candidate signal a predetermined amount of power during a predetermined time, in order to absorb said predetermined amount of energy.

4. The system according to claim 3, wherein said control means are configured to measure at least an electrical parameter of said candidate signal and to control a dissipation current generated in the active load during said predetermined time in order to absorb said predetermined amount of power, and wherein a set-point value of said dissipation current is calculated using the measured electrical parameter of the candidate signal.

5. The system according to claim 3, wherein said control means are configured to:
   detect at least a critical operating condition of the active load occurring during said predetermined time;
   change said predetermined amount of power so as to stop the detected critical condition; and
   accordingly change a duration of the predetermined time such that the active load will absorb from the candidate signal said predetermined amount of energy.

6. The system according to claim 5, wherein said control means are configured to:
   monitor heating in the active load due to a dissipation current generated in the active load during said predetermined time in order to absorb said predetermined amount of power;
   detect an overheating condition;
   electrically drive said active load so as to reduce said dissipation current and stop the overheating condition; and
   accordingly increase a duration of the predetermined time such that the active load absorbs from the candidate signal said predetermined amount of energy.

7. The system according to claim 1, comprising:
   a first electronic board having at least the active load; and
   a second electronic board having at least the binary input, wherein said first and second electronic boards are operatively associated through a connection between the binary input and the active load, and wherein said control means comprise:
   a first control unit in the first electronic board which is operatively associated to said active load for detecting application of the candidate signal to the binary input and for electrically driving the active load upon said detection, such that the active load absorbs said at least a predetermined amount of energy; and
   a second control unit in the second electronic board which is operatively associated to said binary input for validating said candidate signal after the absorption of said predetermined amount of energy, if its residual content of energy exceeds said predetermined threshold.

8. The system according to claim 7, wherein said first control unit is configured to electrically drive said active load so as to continue absorbing energy from said candidate signal for a predetermined additional time interval after absorption of said predetermined amount of energy.

9. The system according to claim 1, wherein said control means are configured to electrically drive said active load so as to at least reduce current flowing in the active load at an end of the validation of the candidate signal.

10. The system according to claim 9, wherein said control means are configured to reduce current flowing in the active load to a holding current at the end of the validation of the candidate signal, wherein said active load is configured for being operatively connected to monitoring and/or diagnostic means, and wherein said monitoring and/or diagnostic means are configured to monitor and/or signal a status of the active load and/or one or more parts of said electronic system by using said holding current.

11. An electrical apparatus comprising:
an electronic system according to claim 1.

12. A switchgear comprising:
an electrical apparatus according to claim 11.

13. A method for validating a candidate signal applied to a binary input in an electronic system associated to an electrical apparatus, said method comprising:
operatively connecting at least an electronic active load having one or more electronic active devices to said binary input;
detecting application of said candidate signal to the binary input;
electrically driving said active load to absorb at least a predetermined amount of energy from the candidate signal upon detection of the application of said candidate signal; and
after the absorption of said predetermined amount of energy, validating the candidate signal if its residual content of energy exceeds a predetermined threshold.

14. The method according to claim 13, wherein said step of validating the candidate signal comprises:
electrically driving the active load so as to continue absorbing energy from the candidate signal during at least a time for performing the validation.

15. The method according to claim 13, wherein absorbing the predetermined amount of energy comprises:
absorbing a predetermined amount of power from said candidate signal during a predetermined time.

16. The method according to claim 15, wherein said step of electrically driving the active load to absorb at least the predetermined amount of energy comprises:
measuring at least an electrical parameter of the candidate signal and controlling a dissipation current generated in the active load during said predetermined time in order to absorb said predetermined amount of power, wherein controlling said dissipation current includes calculating a set-point value of said dissipation current using said measured electrical parameter.

17. The method according to claim 15, wherein said step of electrically driving the active load to absorb at least the predetermined amount of energy comprises:
detecting at least a critical operating condition of the active load occurring during said predetermined time;
changing the predetermined amount of power to be absorbed from the candidate signal so as to stop the detected critical condition; and
accordingly changing a duration of the predetermined time so as to absorb from the candidate signal said predetermined amount of energy.

18. The method according to claim 13, comprising:
electrically driving the active load so as to at least reduce current flowing in the active load at an end of the validation of the candidate signal.

19. The method according to claim 18, wherein said step of electrically driving to reduce the current flowing in the active load comprises:
reducing the current flowing in the active load to a holding current at the end of the validation of the candidate signal; and
monitoring and/or signaling a status of the active load and/or one or more parts of the electronic system by using said holding current.

20. The method according to claim 13, comprising:
electrically driving said active load so as to continue absorbing energy from said candidate signal for a predetermined additional time interval, after the absorption of said predetermined amount of energy.

* * * * *